United States Patent
Jang et al.

(10) Patent No.: US 12,088,321 B2
(45) Date of Patent: Sep. 10, 2024

(54) DEVICE AND METHOD FOR DECODING POLAR CODE IN COMMUNICATION SYSTEM

(71) Applicant: Samsung Electronics Co., Ltd., Suwon-si (KR)

(72) Inventors: Min Jang, Suwon-si (KR); Jonghwan Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 192 days.

(21) Appl. No.: 17/788,526

(22) PCT Filed: Dec. 17, 2020

(86) PCT No.: PCT/KR2020/018557
§ 371 (c)(1),
(2) Date: Jun. 23, 2022

(87) PCT Pub. No.: WO2021/132983
PCT Pub. Date: Jul. 1, 2021

(65) Prior Publication Data
US 2023/0034299 A1 Feb. 2, 2023

(30) Foreign Application Priority Data
Dec. 24, 2019 (KR) .......... 10-2019-0174395

(51) Int. Cl.
*H03M 13/15* (2006.01)
*H03M 13/39* (2006.01)
(Continued)

(52) U.S. Cl.
CPC ..... *H03M 13/155* (2013.01); *H03M 13/3927* (2013.01); *H03M 13/1108* (2013.01); *H03M 13/1174* (2013.01); *H04L 1/0042* (2013.01)

(58) Field of Classification Search
CPC .......... H03M 13/155; H03M 13/3927; H03M 13/1108; H03M 13/1174; H04L 1/0042
See application file for complete search history.

(56) References Cited

U.S. PATENT DOCUMENTS

| | | |
|---|---|---|
| 2014/0173376 A1 | 6/2014 | Jeong et al. |
| 2016/0056843 A1 | 2/2016 | Gross et al. |

(Continued)

FOREIGN PATENT DOCUMENTS

| | | |
|---|---|---|
| KR | 10-1951663 B1 | 2/2019 |
| KR | 10-2019-0034665 A | 4/2019 |

(Continued)

OTHER PUBLICATIONS

Hashemi et al., Rate-Flexible Fast Polar Decoders, XP033709249, 2019.

(Continued)

*Primary Examiner* — Joseph J Lauture
(74) *Attorney, Agent, or Firm* — Jefferson IP Law, LLP

(57) ABSTRACT

The present disclosure relates to a $5^{th}$ generation (5G) or pre-5G communication system for supporting a data transmission rate higher than that of a post-$4^{th}$ generation (4G) communication system such as Long Term Evolution (LTE). The present disclosure is for decoding a polar code in a communication system. An operation method of a reception device comprises the steps of: receiving data encoded by means of a polar code and comprising a plurality of bits; confirming one or more bits which do not require a decoding operation among the plurality of bits; and decoding at least some of the bits remaining after excluding the one or more bits.

15 Claims, 17 Drawing Sheets

(51) Int. Cl.
  *H03M 13/11* (2006.01)
  *H04L 1/00* (2006.01)

(56) References Cited

U.S. PATENT DOCUMENTS

2019/0166611 A1* 5/2019 Noh .................. H04W 72/1273
2019/0207712 A1 7/2019 Chen
2019/0268022 A1 8/2019 Xu et al.

FOREIGN PATENT DOCUMENTS

WO  2018/161274 A1  9/2018
WO  2018/231924 A1  12/2018
WO  2019/011555 A1  1/2019
WO  2019/227276 A1  12/2019

OTHER PUBLICATIONS

Zhang et al., A Split-Reduced Successive Cancellation List Decoder for Polar Codes, XP011593861, Feb. 2016.
Bioglio et al., Design of Polar Codes in 5G New Radio, XP081014817, Jan. 9, 2019.
Extended European Search Report dated Dec. 20, 2022, issued in European Patent Application No. 20904850.3.
Korean Office Action dated Nov. 13, 2023, issued in Korean Patent Application No. 10-2019-0174395.
Arikan et al., Channel Polarization, a method for constructing capacity-achieving codes for symmetric binary-input memoryless channels, Jul. 20, 2009.
Tal et al., List Decoding of Polar Codes, May 31, 2012.
3GPP TS 38.212 V15.1.0, 3rd Generation Partnership Project, Technical Specification Group Radio Access Network, NR, Multiplexing and channel coding, (Release 15), Mar. 2018.
Jang et al., Rate matching for polar codes based on binary domination, Jan. 8, 2019.
Alamdar-Yazdi et al., A Simplified Successive-Cancellation Decoder for Polar Codes, IEEE Communications Letters, vol. 15, No. 12, Dec. 2011.
Ali Hashemi et al., Simplified successive-cancellation list decoding of polar codes, Jul. 2016.
Nokia, Nokia Shanghai Bell, Bit-interleaving for polar codes, R1-1716786, 3GPP TSG RAN WG1 Meeting NR#3, Nagoya, Japan, Sep. 18-21, 2017.
Korean Notice of Patent Grant dated Jul. 8, 2024, issued in Korean Application No. 10-2019-0174395.

\* cited by examiner

DEVICE AND METHOD FOR DECODING POLAR CODE IN COMMUNICATION SYSTEM

TECHNICAL FIELD

The disclosure generally relates to resource allocation in a communication system and, more particularly, to a device and method for polar code decoding in a communication system.

BACKGROUND ART

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a "beyond 4G network" communication system or a "post long term evolution (post LTE)" system.

The 5G communication system is considered to be implemented in ultrahigh frequency (mmWave) bands (e.g., 60 GHz bands) so as to accomplish higher data rates. To decrease the propagation loss and increase the transmission distance of the radio waves in the ultrahigh frequency bands, beamforming, massive multiple-input multiple-output (massive MIMO), full dimensional MIMO (FD-MIMO), array antenna, analog beam forming, large scale antenna techniques are discussed in 5G communication systems.

In addition, in 5G communication systems, technical development for system network improvement is under way based on advanced small cells, cloud radio access networks (cloud RANs), ultra-dense networks, device-to-device (D2D) communication, wireless backhaul, moving network, cooperative communication, coordinated multi-points (CoMP), reception-end interference cancellation and the like.

In the 5G system, hybrid frequency shift keying and quadrature amplitude modulation (FQAM) and sliding window superposition coding (SWSC) as an advanced coding modulation (ACM) scheme, and filter bank multi carrier (FBMC), non-orthogonal multiple access (NOMA), and sparse code multiple access (SCMA) as an advanced access technology have also been developed.

Generally, in the case in which a transmitter and a receiver perform data transmission and reception in a communication system or a broadcasting system, a data error may occur due to noise existing in a communication channel. As an encoding scheme that is designed to enable a receiver to process such error caused by a communication channel, there are an error detection codes scheme and an error correcting codes (ECC) scheme. The error detection codes scheme is a method of identifying whether an error is included in data that a receiver receives, and the error correcting codes (ECC) scheme is a method of autonomously correcting an error included in data that a receiver receives. Here, the ECC is referred to as channel coding.

The ECC scheme includes various types of schemes. For example, there are a convolutional code scheme (convolutional coding), a turbo code scheme (turbo coding), a low-density parity-check code scheme (low-density parity-check coding (LDPC coding)), a polar code scheme (polar coding), and the like. Particularly, a turbo code, a low-density parity-check code, and a polar code are excellent codes having a performance almost close to a theoretical channel capacity, and may be utilized in various communication systems these days. Among the ECC schemes, a polar code is first theoretically proved as a code capable of achieving a point-to-point channel capacity with a low decoding complexity based on a channel polarization phenomenon that occurs when successive cancellation (SC) decoding is performed. In addition, it is identified that a polar code having a short length provides a great performance when SC-list (SC1) decoding and the like are used, in comparison with other channel codes. For the reason, a polar code is used when 3GPP release-15 NR, which is the 5G communication standard, transmits control information.

DISCLOSURE OF INVENTION

Technical Problem

Based on the above-described discussion, the disclosure provides a device and method for decreasing the decoding complexity and latency using a polar code in a communication system.

In addition, the disclosure provides a device and method for reducing the number of times that a decoding operation using a polar code is performed in a communication system.

In addition, the disclosure provides a device and method for determining a bit that does not need an operation in a decoding operation using a polar code in a communication system.

Solution to Problem

According to various embodiments of the disclosure, an operation method of a reception device in a communication system may include an operation of receiving data including a plurality of bits encoded using a polar code, an operation of identifying at least one bit that does not need a decoding operation among the plurality of bits, and an operation of decoding at least some of the bits remaining after excluding the at least one bit.

According to various embodiments of the disclosure, a reception device in a communication system may include a transceiver and at least one processor connected to the transceiver. The at least one processor is configured to receive data including a plurality of bits encoded using a polar code, to identify at least one bit that does not need a decoding operation among the plurality of bits, and to decode at least some of the bits remaining after excluding the at least one bit.

Advantageous Effects of Invention

A device and method according to various embodiments of the disclosure may omit some of a decoding operation, and may decrease a decoding complexity and latency. Advantageous effects obtainable from the disclosure may not be limited to the above-mentioned effects, and other effects which are not mentioned may be clearly understood, through the following descriptions, by those skilled in the art to which the disclosure pertains.

BEST MODE FOR CARRYING OUT THE INVENTION

Figure 1:
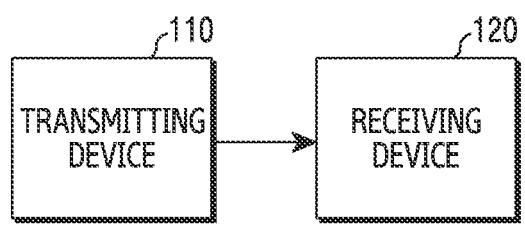
FIG. 1 is a diagram illustrating a wireless communication system according to various embodiments of the disclosure.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software, and thus the various embodiments of the disclosure may not exclude the perspective of software.

Hereinafter, the disclosure relates to a device and a method for decoding using a polar code in a communication system. Particularly, the disclosure describes technology that decreases the complexity of a decoding operation based on a polar code in a communication system. More particularly, the disclosure relates to error-correcting codes that correct or restore data when an error or data loss occurs or is likely to occur due to various factors such as noise, interference, or the like in the process of transmitting or storing data. In other words, the disclosure relates to decoding that a receiver performs in a communication system using a polar code, and relates to technology that decodes, at low complexity and latency, a codeword encoded with a polar code.

In the following description, terms referring to parameters, terms referring to redundancy bits (e.g., parity check bits), terms referring to information bits, terms referring to channels, terms referring to control information, terms referring to network entities, terms referring to device elements, and the like are illustratively used for the sake of convenience. Therefore, the disclosure is not limited by the terms as used below, and other terms referring to subjects having equivalent technical meanings may be used.

Furthermore, various embodiments of the disclosure will be described using terms defined in some communication standards (e.g., 3rd generation partnership project (3GPP) standards), but they are illustrated merely for the sake of description. Various embodiments of the disclosure may be easily applied to other communication systems through modifications.

A polar code is an error correcting code proposed by E. Arikan in 2008, and is proven as a first error correcting code that has a low encoding/complexity performance, and is capable of achieving a channel capacity corresponding to a data transmission limit in all binary discrete memoryless channels (B-DMCs). The polar code has an advantage in terms of an error-correcting performance and decoding complexity in the case of transmitting a code shorter than a turbo code and a low-density parity-check (LDPC) code which are other channel capacity-approaching codes. In consideration of the advantages, the ongoing 3GPP NR standardization for 5G mobile communication in 2017 determines to use a polar code for transmitting control information having a short length.

The disclosure considers a system for polar code encoding and decoding used in a communication system. A basic polar code decoding method is a successive cancellation (SC) decoding. An SC decoder sequentially decodes an encoded input bit sequence by one bit, and may use a decoded bit result obtained in advance when decoding a bit. An SC-list (SCL) decoding, SC-stack (SCS) decoding, an SC-flip (SCF) decoding, and the like used for improving performance basically use a successive decoding scheme. Due to such features of the successive decoding operation, SC-based decoders are inappropriate to be embodied in a parallelized architecture and a pipeline architecture, and a clock cycle that is needed for decoding a turbo code and an LDPC code appropriate for parallel processing is larger, which is a drawback. That is, the SC-based decoder of the polar code may generally have a low decoding throughput.

In addition, in the case of the SCL decoder used for improving performance, complexity is high, which is a drawback. The SCL decoder maintains candidate groups, the number of which corresponds to the number of lists configured in advance, and independently decodes each candidate group. In the decoding process of each bit, decoding of each list is independently performed, and a list having a high probability is maintained and a list having a low probability is excluded based on a decoding result. Therefore, the number of operations that the SCL decoder performs and the period of time taken may increase in proportional to the number of lists.

The disclosure is to decrease the decoding complexity and latency of an SC decoder, an SCL decoder, and the like of a polar code system that supports various code parameters (code length, rate matching, and the like) and configurations. An embodiment to which the disclosure is applied may be a polar code system that is used for 3GPP NR control signal transmission. The 3GPP NR polar code system may encode bits having a length of 12 to 1706, and may support various rate matching. The disclosure is to decrease the complexity of an SC decoder, an SCL decoder, and latency used in a polar code system that supports various code lengths and rate matchings. In addition, the disclosure is to minimize costs for additional hardware, the amount of operations performed, the period of time spent in performing operations, and the like which are needed to achieve the objective. For example, conventionally, there is provided a method of analyzing the structure of a polar code based on a code parameter in advance, and configuring, based on an analyzed result, a simplified SCL decoder that is dedicated for a corresponding code. A method of analyzing a code structure in advance, and adding a dedicated operation block may be effectively in the case in which the code structure is static or the number of types of code parameters used is small. However, in the case in which the number of code parameters need to be supported is large (e.g., in the case in which various code lengths and rate matching are supported such as 3GPP NR), it may be ineffective to configure the simplified SCL decoder. A code analyzing process added to configure a simplified SCL decoder based on given code parameters may instead increase the number of operations performed and the period of time spend in performing operations, which is different from the original purpose of simplifying a decoder. The disclosure is to overcome the drawback of the conventional art that is inappropriate or ineffective for a communication system that supports various parameters. That is, the disclosure is to minimize operations additionally performed to support various code parameters and code structures, in addition to an original SCL decoding operation, and latency caused from the additional operations.

FIG. 1 is a diagram illustrating a wireless communication system according to various embodiments of the disclosure. FIG. 1 illustrates a transmitting device 110 and a receiving device 120 as some of the nodes that use a wireless channel in a wireless communication system. Although FIG. 1 illustrates the single transmitting device 110 and the single receiving device 120, a plurality of transmitting devices or a plurality of receiving devices may be included. In addition, for ease of description, the transmitting device 110 and the receiving device 120 are described as separate entities but the function of the transmitting device 110 and the function of the receiving device 120 may be changed to each other in the disclosure. For example, in the case of an uplink of a cellular communication system, the transmitting device 110 may be a user equipment (UE), and the receiving device 120 may be a base station. In the case of a downlink, the transmitting device 110 may be a base station, and the receiving device 120 may be a UE. According to some embodiments, the transmitting device 110 may perform information bit encoding using a polar code and may perform transmission. The receiving unit 120 may decode the encoded information transmitted from the transmitting device 110 using the polar code, and may restore the information bits.

Figure 2:
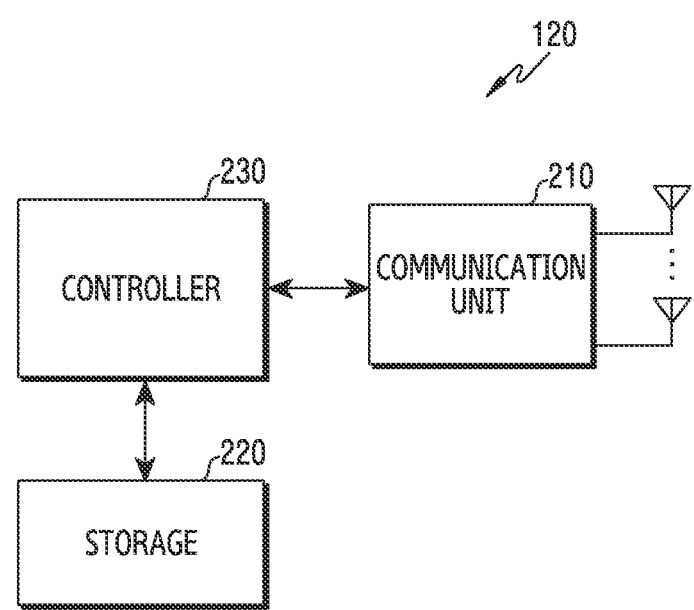
FIG. 2 is a diagram illustrating an example of the configuration of a receiving device in a wireless communication system according to various embodiments of the disclosure.

FIG. 2 is a diagram illustrating an example of the configuration of a receiving device in a wireless communication system according to various embodiments of the disclosure. The configuration illustrated in FIG. 2 may be understood as the configuration of the receiving device 120. The term ' . . . unit' or the ending of a word, such as ' . . . er' or the like may refer to a unit of processing at least one function or operation, and this may be embodied by hardware, software, or a combination of hardware and software.

Referring to FIG. 2, the receiving device 120 may include a communication unit 210, a storage 220, and a controller 230.

The communication unit 210 may perform functions for transmitting or receiving a signal via a wireless channel. For example, the communication unit 210 may perform a function of conversion between a baseband signal and a bit string according to the physical layer standard of a system. For example, in the case of data transmission, the communication unit 210 may produce complex symbols by encoding and modulating a transmission bit string. In addition, in the case of data reception, the communication unit 210 may restore a reception bit string by demodulating and decoding a baseband signal. In addition, the wireless communication unit 210 up-converts a baseband signal into a radio-frequency (RF) band signal and transmits the same via an antenna, and down-converts an RF band signal received via an antenna into a baseband signal.

To this end, the communication unit 210 may include a transmission filter, a reception filter, an amplifier, a mixer, an oscillator, a digital-to-analog convertor (DAC), an analog-to-digital convertor (ADC), and the like. In addition, the communication unit 210 may include a plurality of transmission/reception paths. In addition, the communication unit 210 may include at least one antenna array including a plurality of antenna elements. From the perspective of hardware, the communication unit 310 may be configured with a digital unit and an analog unit. The analog unit may include a plurality of sub-units depending on operating power, an operating frequency, or the like.

The communication unit 210 may transmit and receive signals as described above. Accordingly, the communication unit 210 may also be referred to as a 'transmitter', a 'receiver', or a 'transceiver'. In addition, in the following descriptions, the transmission and reception performed via a wireless channel may be used as a meaning indicating that the above-described processing is performed by the communication unit 210. In addition, the communication unit 210 may include a backhaul communication unit for communication with another network entity connected via a backhaul network.

The communication unit 210 may include a decoder (not illustrated) for performing decoding according to various embodiments of the disclosure. The decoder may perform a decoding operation based on a polar code.

The storage 220 may store data such as basic programs, application programs, configuration information, and the like for the operation of the receiving device 120. The storage 220 may be configured as a volatile memory, a non-volatile memory, or a combination of a volatile memory and a non-volatile memory. In addition, the storage 220 may provide data stored therein in response to a request from the controller 230.

The controller 230 may control the overall operations of the receiving device 120. For example, the controller 230 may perform signal transmission and reception via the communication unit 220. Further, the controller 230 may record data in the storage 230 and may read recorded data therefrom. To this end, the controller 230 may include at least one processor or micro-processor, or may be a part of the processor. In other words, the controller 230 may control the operation of each element included in the communication unit 220. For example, the controller 230 may perform control so that the receiving device 120 performs operations according to various embodiments.

Figure 3:
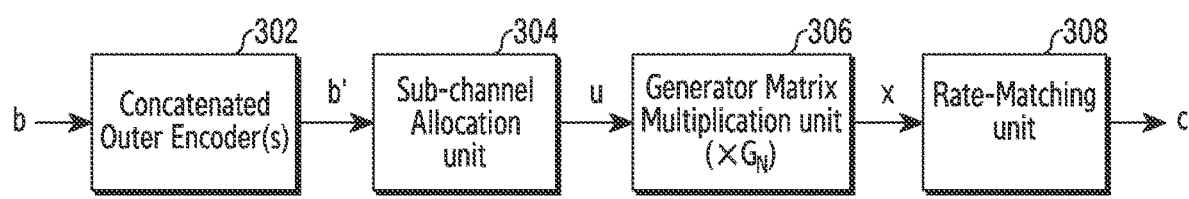
FIG. 3 is a diagram illustrating an example of a polar code encoding process in a communication system according to various embodiments of the disclosure.

FIG. 3 is a diagram illustrating an example of a polar code encoding process in a communication system according to various embodiments of the disclosure. Among the operations in FIG. 3, some of the process may be omitted or a separate operation may be added according to required conditions and characteristics of a system. In FIG. 3, it is expressed that the number of information bits that a transmitting device needs to transmit is A and the number of codeword bits that are encoded and transmitted via a channel is E. Each operation of encoding performed in the transmitting device is as follows.

1) Information Bit Sequence Generation

An information bit sequence $b=\{b_0, b_1, \ldots, b_{A-1}\}$ having a length of A that is desired to be transmitted is given. The information bit sequence may be a part of the entire information desired to be transmitted, that is, a segment.

2) Outer Code

In a concatenated outer encoder 302, the information bit sequence b may be encoded into a concatenated outer code first to improve performance. Such outer code may be normally used to increase the performance of the decoder that performs decoding in consideration of a plurality of codeword candidate groups, such a polar code-based SC-list (SCL) decoding. The SCL decoding will be described in detail with reference to the operation of a receiving device. An outer code that is concatenated to a polar code and is used for this purpose may include an error detection code such as a cyclic redundancy check (CRC) code or an error correcting code such as a BCH code, a parity check (PC), a convolutional code, or the like. A single outer code may be used, or two or more outer codes may be used complexly. For example, among polar codes defined in 3GPP NR, a polar code used for uplink control information may be used together with a 11-bit CRC code depending on the length of information bit, that is, in the case in which the length of information bit is greater than or equal to 20 bits, and may be used together with a 3-bit PC code and a 6-bit CRC code in the case in which the length of information bit is less than or equal to 19 bits. The outer coding may add a parity bit to an input bit sequence as a systematic code. The length of the entire parity bit produced by one or more outer codes is B, and the length of a codeword produced by outer coding is K=A+B. The bit sequence produced as a result of outer encoding is $b'=\{b'_0, b'_1, \ldots, b'_{K-1}\}$. The outer encoding is not an essential operation for polar coding and thus, the output encoding may be omitted and, in this instance, B=0 and b'=b.

3) Sub-Channel Allocation

In the sub-channel allocator 304, a bit sequence b' is mapped to a bit sequence $u=\{u_0, u_1, \ldots, u_{N-1}\}$ having a length of N in order to perform polar code encoding. Here, N is the size of a mother polar code, is expressed by the $n^{th}$ power of 2, and is determined based on predetermined criterion among values greater than K. The bit sequence u is a polar code encoder input bit sequence, and the bits of b' are mapped to u according to a predetermined method and criterion (in the sub-channel allocator 304). Each bit of the encoder input bit sequence u may be construed as though they pass through sub-channels (split channel, sub-channel) that are virtual channels having different qualities via channel polarization by the operation of a transmitting device and the receiving device. In this instance, each sub-channel is referred to as a synthetic channel. In order to map the bits of the b' to map the bits of u that pass through sub-channels having good quality, a channel capacity (symmetric capacity), a Bhattacharyya parameter, a density evolution result, and the like associated with each sub-channel are used. In addition, in the process, rate-matching operation to be subsequently performed is taken into consideration. Due to the characteristics, the process of mapping b' to u is referred to as a sub-channel allocation process. In this process, a bit of u corresponding to a sub-channel to which b' is mapped is referred to as an unfrozen bit, and a bit of u corresponding to the remaining sub-channel is referred to as a frozen bit. As described in the name, the frozen bit has a fixed value, and the value is generally 0.

4) Generator Matrix Multiplication

In a generator matrix multiplication unit 306, an encoder input bit sequence u having a length of N is multiplied by a generator matrix G of a polar code, and accordingly, an encoder output bit sequence x having a length of N is produced. When a polar code is proposed first by Arikan, a generator matrix G may be defined as shown in Equation 1.

$$G = B_N F^{\otimes log_2 N} \quad \text{Equation 1}$$

In equation $$F = \begin{bmatrix} 1 & 0 \\ 1 & 1 \end{bmatrix},$$

and a superscript ⊗ n operation is $n^{th}$ Kronecker power. For example, $$F^{\otimes 2} = \begin{bmatrix} F & 0 \\ F & F \end{bmatrix}, \text{ and } F^{\otimes 3} = \begin{bmatrix} F^{\otimes 2} & 0 \\ F^{\otimes 2} & F^{\otimes 2} \end{bmatrix}.$$

$B_N$ is an N×N bit-reversal permutation matrix. For example, by multiplying a vector $\{a_0, a_1, a_2, a_3, a_4, a_5, a_6, a_7\}$ having a length of 8 and a 8×8 bit-reversal permutation matrix $B_8$, $\{a_0, a_4, a_2, a_6, a_1, a_5, a_3, a_7\}$ having an index to which bit-reversal permutation is performed is obtained. However, according to another embodiment, a simplified generator matrix, excluding $B_N$, such as Equation 2 may be used.

$$G = F^{\otimes log_2 N} \quad \text{Equation 2}$$

Hereinafter, unless otherwise mentioned, it is assumed that a generator matrix defined to be $G=F^{\otimes log_2 N}$ is used. It should be construed that the description provided based on the assumption may be described easily by changing to a polar code that uses a generator matrix defined to be $G=B_N F^{\otimes log_2 N}$ based on a bit-reversal permutation operation.

5) Rate-Matching

The rate-matching unit 308 performs an operation of generating a bit sequence having a length of E that is desired to be transmitted, from a generated encoder output bit sequence x. A transmission bit sequence obtained via rate matching may be expressed by c. According to rate matching, an encoder output bit sequence x may be rematched in order to improve the performance of a polar code. For example, in the 3GPP NR polar coding system, an encoder output bit sequence x may be interleaved based on a 32 sub-block unit, may be stored in a circular buffer, and may be sequentially extracted, and thus a codeword sequence having a length of E may be produced. In the case in which E that is the length of the codeword is less than E that is the size of a polar code mother code, one of puncturing or shortening may be performed. If some bits of the encoder output bit sequence x is punctured, some of the sub-channels that the encoder input bit sequence u goes through may be incapable, and a sub-channel allocation process may be performed in consideration of the incapable bit. In the case in which some bits of the encoder output bit sequence x needs to be shortened, some of the bits of the encoder input bit sequence u also need to be shortened, and the sub-channel allocation process may be performed in consideration of a shortened bit (shortening bit). Conversely, if E that is the length of the codeword is greater than E that is the size of the polar code mother code, repetition may be performed.

Figure 4:
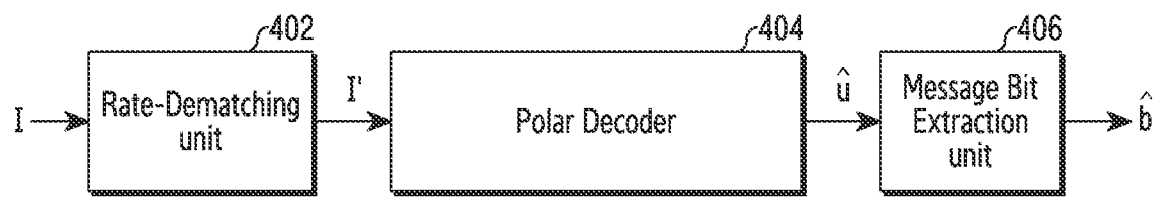
FIG. 4 is a diagram illustrating an example of a polar code decoding process in a communication system according to various embodiments of the disclosure.

FIG. 4 is a diagram illustrating an example of a polar code decoding process in a communication system according to various embodiments of the disclosure. According to a required condition or the like of a system, another operation may be added, or an included operation may be omitted among the operations illustrated in FIG. 4.

1) Demodulated LLR Generation

Probability information corresponding to a bit c that is transmitted after demodulation of a received signal may be produced. A probability vector, a likelihood ratio (LR), a log-likelihood ratio (LLR) and the like are given as the probability information. For ease of description, an LLR is considered, unless otherwise mentioned. However, the disclosure is not limited to an LLR-based decoding operation. The LLR sequence corresponding to a transmission bit sequence c may be referred to as $l=\{l_0, l_1, \ldots, l_{E-1}\}$.

2) Rate-Dematching

In a rate dematching unit 402, an LLR sequence l having a length of E may go through a rate dematching process of a transmitting device so as to be input into a polar code encoder 404 having a length of N. In the case in which puncturing occurs in the rate matching unit of the transmitting device, an LLR value for a corresponding bit is determined to be 0. In the case in which shortening occurs, an LLR value for the corresponding bit may be determined to be the maximum value of an LLR value corresponding to a bit value of 0. In the case in which a predetermined bit is repeated, all corresponding LLR values may be combined and an LLR value for the corresponding bit may be determined. An LLR sequence having a length of N determined through the above-described process is referred to as $l'=\{l'_0, l'_1, \ldots, l'_{N-1}\}$.

3) SC Decoding Using an Outer Coding (Outer Code Aided SC-Based Decoding)

In the polar code decoder 404, an LLR sequence l' having a length of N is calculated or determined, an SC-based decoding operation may be performed based thereon. As an SC-based decoding may include a normal SC decoding, SC-list (SCL) decoding, SC-stack (SCS) decoding, and the like. Such SC-based decoding sequentially decodes each bit of an encoder input sequence in order of indices. Such decoders may perform decoding of each bit in order of indices of the encoder input bit sequence, that is, in order of $u_0, u_1, \ldots, u_{N-1}$. Particularly, decoding of an $i^{th}$ bit, $u_i$, is performed according to the following procedure.

① Calculate a probability-based index (metric) associated with a $u_i$ value of 0 and 1 based on a received signal and estimated values $\hat{u}_0, \hat{u}_1, \ldots, \hat{u}_{i-1}$ of bits decoded in advance ② Perform estimation of a bit value $\hat{u}_i$ based on the calculated probability-based index ③ Apply the estimated value $\hat{u}_i$ to a decoder based on successive cancellation in order to decode a subsequent bit.

As described above, decoding of each bit is performed based on bit values that are decoded and estimated previously. In the case of decoding bit $u_i$, estimated values $(\hat{u}_0, \ldots, \hat{u}_{i-1})$ of previously decoded bits $(u_0, \ldots, u_{i-1})$ and probability information related thereto or an accumulated value equivalent to the probability information, and the like may be used. Here, each partial bit sequence $(\hat{u}_0, \ldots, \hat{u}_{i-1})$ is referred to as a list or a path, and accumulated probability information obtained by decoding each path or a value equivalent to the probability information is referred to as a path-metric (PM). An SCL decoder performs decoding by maintaining lists $(\hat{u}_0, \ldots, \hat{u}_{i-1})$, the number of which corresponds to a list size L configured when decoding is performed. For example, the SCL decoder may calculate probability information associated with a $u_i$ value of 0 and 1 based on the list $(\hat{u}_0, \hat{u}_{i-1})$ maintained up to date in decoding. A PM associated with each list $(\hat{u}_0, \ldots, \hat{u}_{i-1})$ taken into consideration when the probability information of each $u_i$ is calculated, may be updated with probability information associated with a $u_1$ bit value of 0, and 1, or a value equivalent to probability information, and PMs associated with a total of 2L lists $(\hat{u}_0, \ldots, u_{i-1}, \{0 \text{ or } 1\})$ may be calculated. In the case in which $u_i$ is a frozen bit, a bit value that a transmitting device/receiving device agreed upon irrespective of the calculated PM is determined as an estimated value $\hat{u}$. In the case in which $u_i$ is an information bit among unfrozen bits, L lists $\hat{u}_0, \ldots, \hat{u}_{i-1}, \hat{u}_i$ that are determined as having a high probability based on the PM value may be selected among the total 2L lists. In the same manner, the SCL decoder performs decoding by maintaining a total of L lists for each decoding of each bit. In the case in which decoding of all bits is completed, a codeword having the highest probability among finally obtained L lists, that is, among candidate bit sequences, may be selected based on the PM. In the case in which L is set to 1, the SCL decoder may operate in the same manner as the normal SC decoder. While the SCL decoding is performing or after the SCL decoding is completed, an error correction performance may be improved by utilizing a concatenated outer encoding. In the case in which a CRC code is concatenated and is used, a codeword that satisfies a restricted condition for the CRC code and has the highest probability among L lists obtained after decoding may be estimated as a final decoding result.

4) Message Bit Extraction

In a message bit extractor 405, a message bit at a predetermined location may be obtained from an estimated encoder input bit sequence $\hat{u}=(\hat{u}_0, \hat{u}_1, \hat{u}_{N-1})$ A finally estimated message bit sequence may be expressed as b.

The generator matrix multiplication process in the encoding process described with reference to FIG. 3 and the SC-based decoding process in the decoding process described with reference to FIG. 4 may be described using a graph corresponding to a polar code.

Figure 5:
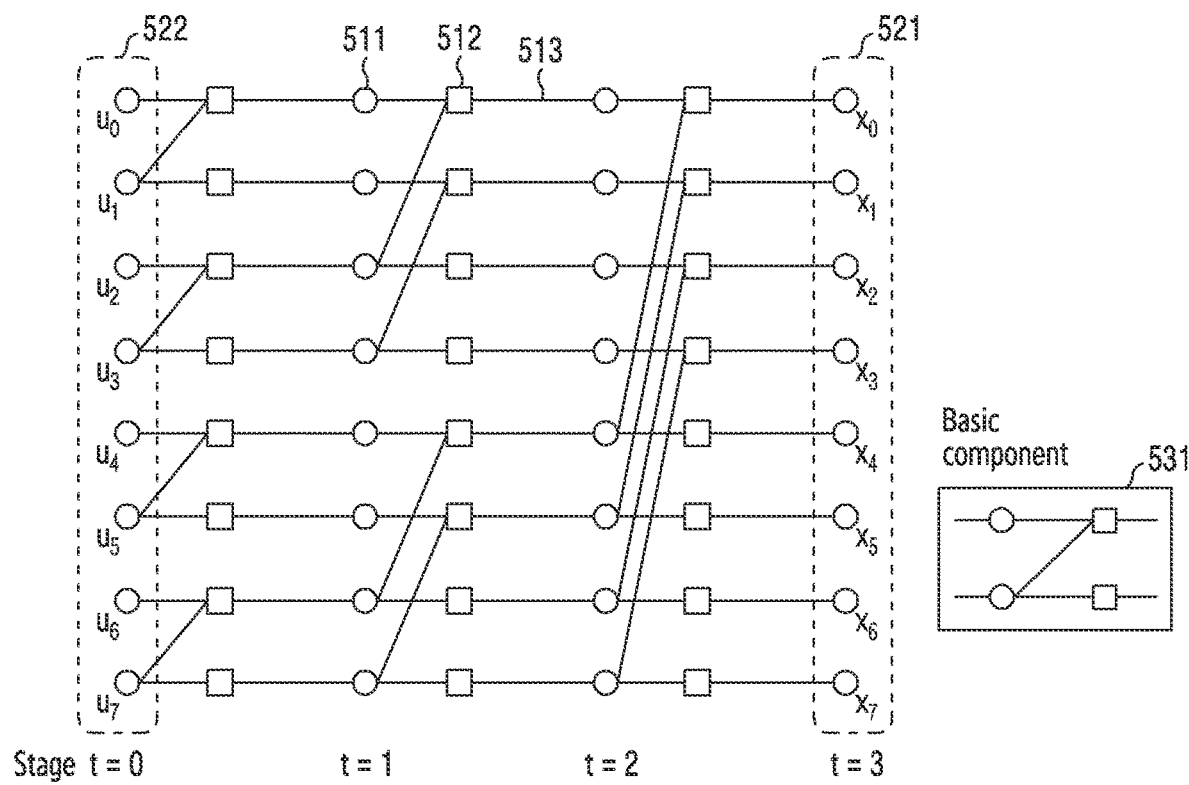
FIG. 5 is a diagram illustrating an example of a graph corresponding to a polar code in a communication system according to various embodiments of the disclosure.

FIG. 5 illustrates an example of a graph corresponding to a polar code in a communication system according to various embodiments of the disclosure. FIG. 5 is a bipartite graph associated with a polar code having a size of 8.

Referring to FIG. 5, the bipartite graph includes variable nodes 511 expressed as a circular shape, check nodes 512 expressed as a square shape, and edges 513 that connect the nodes. In an encoding process, a variable node is each bit, and each variable node shows probability information such as an LLR and the like associated with the corresponding bit in the decoding process. A check node is the linear constraint of neighboring connected variable nodes, and the modulo-2 sum of all bits corresponding to a neighboring variable node of a single check node is 0. A polar code graph having a length of N may be configured by $\log_2 N+1$ stages. Symbol t denotes a stage index in the graph, and the stage index for the variable nodes in the leftmost in the graph is t=0, and the stage index for the variable nodes in the rightmost in the graph is $t=\log_2 N$. One of the characteristics of the polar code graph is that the entire graph is constructed by connection of 2×2 basic components 531 provided in a Z shape. The connection between the basic components in the entire polar code graph may be determined based on a generator matrix of Equation 2.

The generator matrix multiplication process in the encoding process described with reference to FIG. 3 will be understood with reference to the graph of FIG. 5. N variable nodes 521 in the leftmost side in the graph of FIG. 5 correspond to an encoder input bit sequence u having a length of N in the encoding process of FIG. 3, and N variable nodes 522 in the rightmost side correspond to an encoder output bit sequence x having a length of N. The encoding process is a process of calculating the encoder output bit sequence x in the rightmost side to satisfy a relational expression of the check node, based on the encoder input bit sequence u in the leftmost side. That is, the encoding process may be construed as an operation of updating a bit value stage by stage according to a relationship between check nodes and variable nodes connected from the left side to the right side of the graph of FIG. 5.

An SC-based decoding process in the decoding process which has been described with reference to 4 may be understood as belief-propagation in the graph of FIG. 5. As a first stage for decoding, soft-value probability information such as N intrinsic LLRs and the like to which rate dematching is performed may be input to N variable nodes 521 in the rightmost side in the graph. Here, for ease of description, although it is assumed that soft-value probability information is an LLR, the scope of the disclosure is not limited to the assumption. After an intrinsic LLR is configured as described above, an SC-based decoding is performed according to a predetermined procedure. The most important characteristic of the SC-based decoding is that encoder input bit sequence $u=(u_0, u_1, \ldots, u_{N-1})$ corresponding to N variable nodes in the leftmost side in the graph is sequentially decoded for each bit according to a bit index. The sequential decoding of each bit of the encoder input bit sequence u is a process of calculating a-posteriori LLR (AP-LLR) for the corresponding bit, and estimating a bit value based on the calculated LLR. The AP-LLR of each bit is calculated from an intrinsic LLR value given in the rightmost side of the graph, and the process is performed by sequentially calculating an LLR value for a variable node for each stage from the right side to the left side of the graph. That is, the initial intrinsic LLR is given at the stage of $t=\log_2 N$, and LLR values for some variable nodes of respective stages may be calculated in order of $t=\log_2 N-1$, $\log_2 N-2, \ldots$ and the like. Through the process, an LLR value for each variable node at the stage of t=0, that is, an AP-LLR for a single encoder input bit is calculated.

Figure 6:
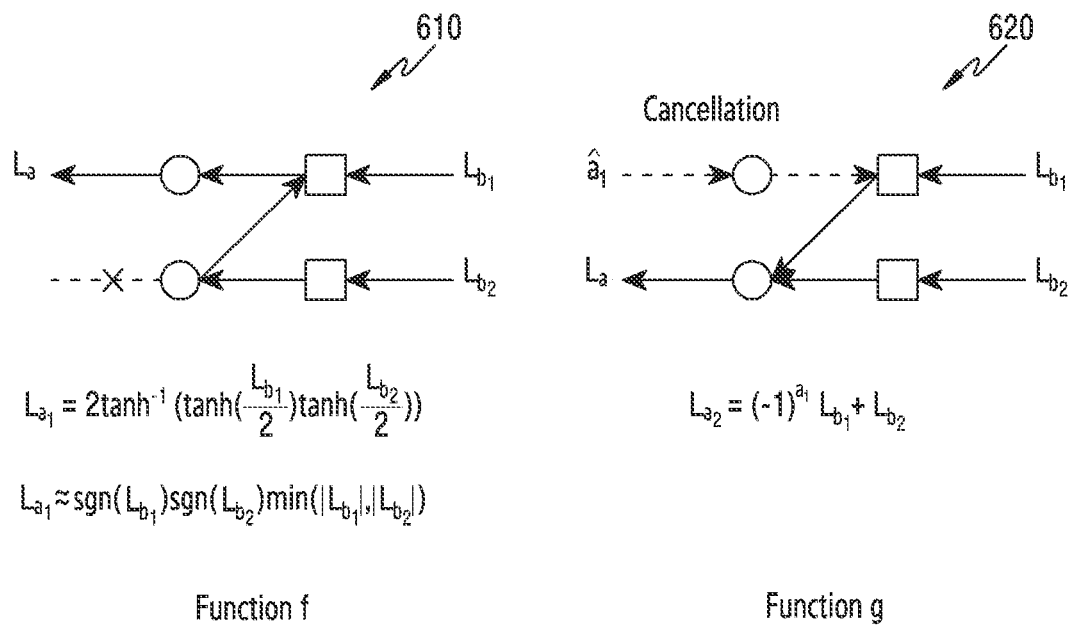
FIG. 6 is a diagram illustrating an LR calculation process in a communication system according to various embodiments of the disclosure.

A detailed LLR calculation process in a polar code graph is as follows. The calculation of all LLR values is performed on the Z-shaped basic component 531 included in the graph. FIG. 6 is a diagram illustrating a process of calculating an LR in a communication system according to various embodiments of the disclosure. This describes 2×2 polar coding of a bit $a=(a_1, a_2)$ corresponding to Z-shaped two variable nodes in the left side and a bit $b=(b_1, b_2)$ corresponding to two variable nodes in the right side, and is expressed as equation below.

$$b = aF = a\begin{bmatrix} 1 & 0 \\ 1 & 1 \end{bmatrix} \qquad \text{Equation 3}$$

In the case in which LLR values corresponding to bits $a_1$, $a_2$, $b_1$, $b_2$ are $L_{a_1}$, $L_{a_2}$, $L_{b_1}$, $L_{b_2}$, respectively, $L_{b_1}$ and $L_{b_2}$ corresponding to two variable nodes in the right side are given in the decoding of each basic component, and the LLR value of one of $L_{a_1}$ and $L_{a_2}$ may be calculated. In the case in which any one bit value of $a_1$ and $a_2$ is not currently estimated, $L_{a_1}$ may be calculated using Equation 4 below, as shown in diagram 610 in the left side of FIG. 6.

$$L_{a_1} = 2\tanh^{-1}(\tanh(0.5 \times L_{b_1})\tanh(0.5 \times L_{b_2})) \qquad \text{Equation 4}$$

The equation is a scheme of accurately calculating an LLR value according to the relationship of bits, and may be approximated to Equation 5 below for embodiment.

$$L_{a_1} \approx \text{sgn}(L_{b_1})\text{sgn}(L_{b_2})\min(|L_{b_1}|,|L_{b_2}|) \qquad \text{Equation 5}$$

In Equation 5, a function sgn(x) is a function that outputs a sign of x. In the case in which the value of x is greater than 0, the function outputs 1, and the value of x is less than 0, the function outputs −1. As shown in Equation 4 or Equation 5, the function of calculating the LLR of $a_1$ is referred to as a $f$ function. In the case in which an estimated value $â_1$ of the bit $a_1$ is obtained as deciding proceeds, $L_{a_2}$ is calculated using Equation 6 as shown in diagram 620 in the right side of FIG. 6.

$$L_{a_2} = (-1)^{â_1} L_{b_1} + L_{b_2} \qquad \text{Equation 6}$$

As shown in Equation 6, the function that calculates the LLR of $a_2$ is referred to as a g function. As described above, SC-based decoding performs bit decoding and estimating sequentially according to a bit index, and thus, decoding of $a_2$ is performed after decoding $a_1$. $L_{a_1}$ and $L_{a_2}$ calculated as described above may be transferred to another Z-shaped basic component connected to the left side in the graph. In this manner, a variable node in the leftmost side of the graph, that is, the LLR value of an encoder input bit at the stage t=0 is obtained, a bit value may be estimated based thereon. In the case in which the corresponding bit is a frozen bit, a value agreed upon between a transmitting device and a receiving device is substituted, irrespective of an LLR value, and in the case in which the corresponding bit is an unfrozen bit, a value obtained by performing hard-decision on an updated LLR value may be substituted. The estimated bit may be transferred to a variable node in the range available for the current decoding stage from the left side to the right side of the graph, and may be used for calculating an LLR of another variable node according to the process of Equation 6.

Figure 7:
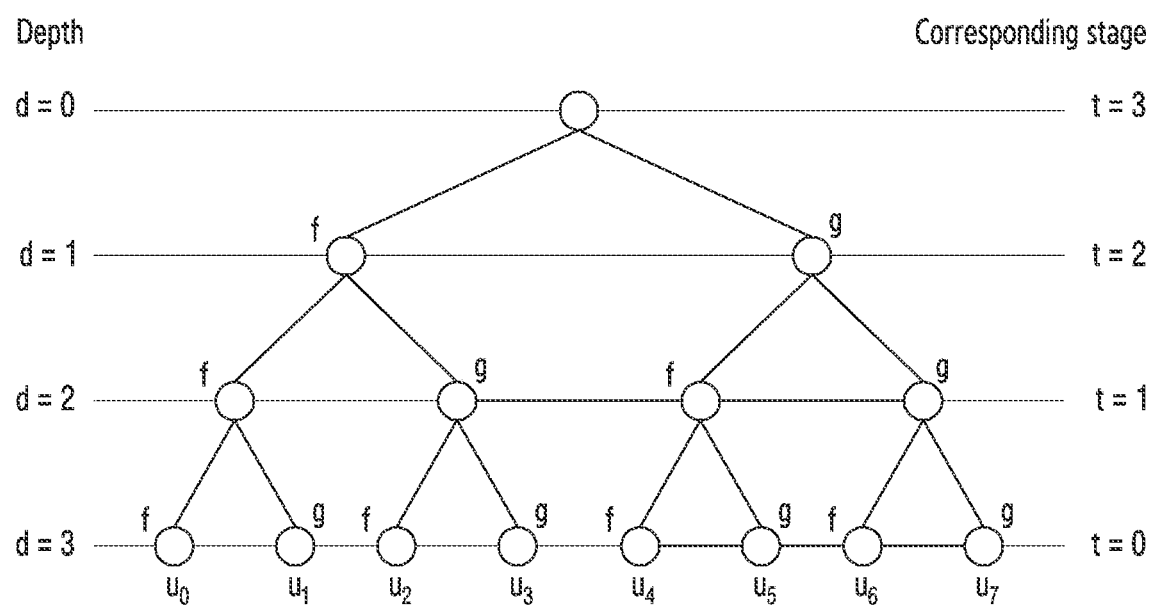
FIG. 7 is a diagram illustrating an example of a decoding binary tree in a communication system according to various embodiments of the disclosure.

FIG. 7 is a diagram illustrating an example of a decoding binary tree in a communication system according to various embodiments of the disclosure. FIG. 7 illustrates a decoding binary tree widely utilized for efficiently describing the type of operation and a procedure that the above-described SC-based decoder performs, and is an example of decoding associated with a polar code having a size of 8. The binary tree may be useful for identifying the type of operation that the SC decoder performs, and the order of operations performed. In the binary tree, a depth corresponds to a stage of the polar code graph of FIG. 5 Leaf nodes in the bottom of the binary tree correspond to variable nodes at stage t=0, and root nodes correspond to variable nodes at stage $t=\log_2 N$. Therefore, in the case in which the depth of the binary tree is d, the relationship with the corresponding stage of the polar code graph may be $d=\log_2 N-t$. In the binary tree, nodes in a depth d may correspond to variable nodes at stage $t=\log_2 N-d$ of the polar code graph. The number of variable nodes at stage $t=\log_2 N-d$ of the polar code graph indicated by a single node in the depth d in the binary tree may be $N/2^d$. Therefore, a root node in a depth d=0 may correspond to all N variable nodes at stage $t=\log_2 N$ of the polar code graph. In addition, the leaf node in a depth $d=\log_2 N$ corresponds to $N/2^{\log_2 N}=1$ variable nodes at stage $t=0$ of the polar code graph, as illustrated in FIG. 7. That is, an $i^{th}$ leaf node refers to an $i^{th}$ encoder input bit $u_i$.

It is construed that the SC-based decoding procedure visits or searches each leaf node from a root node in the binary tree according to a depth-first search (DFS) scheme. In the process of visiting each node according to the DFS scheme, in the case of visiting a left node in the tree, the LLR values of corresponding variable nodes may be calculated based on the ƒ function of Equation 4 or Equation 5, and in the case of visiting a right node, the LLR values of corresponding variable nodes may be calculated based on the g function of Equation 6. For example, as a first operation of SC decoding, visiting a left node in a depth d=1 from the root node in a depth d=0 may be understood as calculating the LLRs of N/2 variable nodes at stage $t=\log_2 N-1$ via ƒ function using intrinsic LLRs in the N variable nodes at stage $t=\log_2 N-0=\log_2 N$. In this manner, via visiting according to the DFS scheme in the binary tree, the LLR values of a half of the variable nodes indicated by a child node may be calculated via a ƒ function or a g function, using the LLRs of the variable nodes indicated by a parent node. In the case in which the LLR value of an $i^{th}$ leaf node is calculated by performing the process according to the DFS, this value may be an AP-LLR for an $i^{th}$ encoder input bit $u_i$. $\hat{u}_i$ is estimated based on the same, and the estimated bit value may be transferred to variable nodes corresponding to the parent node again in a traceback order according to the DFS scheme. In the case of visiting a right child node of the corresponding parent node, a g function operation such as Equation 6 is enabled in each Z-shaped basic component.

In the decoding process described based on the binary tree, the type of operation and the number of operations performed for decoding an $i^{th}$ encoder input bit $u_i$ at each stage in the polar code graph. For example, in the case of decoding $u_0$ in a polar code having a length of 8, ƒ, ƒ, ƒ operations may be performed 4 times, 2 times, and 1 time, respectively, at the stages 2, 1, and 0 of the polar code graph. As another example, in the case of decoding of $u_6$, g, g, ƒ operations may be performed 4 times, 2 times, and 1 time, respectively, at the stages 2, 1, and 0 of the polar code graph. In the case of generalizing this, the type of operation performed for each stage for decoding $u_i$ may be identified from the binary representation of a bit index i. In the case in which the bit index i is expressed as $i=(i_{n-1} i_{n-2} \ldots i_0)_2$ that is a binary number, $i_t$ denotes the type of operation performed at stage t in the polar code graph. In the case in which $i_t=0$, an ƒ operation is performed at the stage t during the process of decoding $u_i$. In the case in which $i_t=1$, an g operation is performed at the stage t during the process of decoding $u_i$.

In addition, based on the description using the DFS scheme of the binary tree, an operation procedure and an operation sequence of the operation of the SC decoder are identified. The situation in which the SC decoder decodes an $i^{th}$ bit $u_i$ of a polar code having a length of N will be considered. It is assumed that two types of functions that the decoder performs, that is, an ƒ function and a g function may be implemented with the same complexity and latency, and the number of all functional operations performed may be identified, without distinguishing the ƒ function and the g function. Without using a special method, the total number of functional operations of the ƒ function and g function needed for decoding a single encoder input bit in the polar code having a length of N may be calculated as follows. As described above, the number of variable nodes of which LLR values are calculated at stage t, that is, the total number of operations is $N/2^d=N/2^{\log_2 N-t}$. To decode each bit, operations are generated from stage $t=\log_2 N-1$ to $t=0$. An operation for an LLR is performed for each of $N/2^{\log_2 N-t}$ variable nodes at stage t and thus, the total number of operations may be calculated as shown in Equation 7 below.

$$\Sigma_{t=0}^{\log_2 N-1} N/2^{\log_2 N-t} = N-1 \qquad \text{Equation 7}$$

The above-described operation is performed for a total of N encoder input bits and thus, the total number of functional operations of the ƒ function and the g function needed for polar code SC decoding is (N−1). However, in the case in which the structure of a polar code is appropriately used, an operation to decode each encoder input bit may not always need to be performed N— 1 times. For example, considering decoding $u_4$ and $u_5$ in a polar code having a length of 8, in the case of decoding a bit $u_4$, g, ƒ, ƒ functional operations may be performed, respectively, at stages 2, 1, and 0, and in the case of decoding a bit $u_5$, g, ƒ, g functional operations may be performed, respectively, at stages 2, 1, and 0. The type of function and an object to which an input is to be provided at stage 2 and stage 1 performed in the decoding of bit $u_4$ and $u_5$ are the same, the corresponding operation does not need to be performed when bit $u_5$ is decoded in the successive decoding process. That is, in the case of decoding bit $u_5$, only the functional operation of the g function at the stage $t=0$ is required. In this manner, in the case in which only a necessary operation is performed when each encoder input bit is decoded, the total number of operations performed may be N $\log_2 N$. That is, in the case in which the SC decoder is efficiently embodied, the SC decoder may be embodied with a complexity of $O(N \log_2 N)$ as opposed to a complexity of $O(N^2)$.

The above-described process will be described using the DFS in the binary tree. In the process of visiting nodes according to DFS scheme, in the case in which the decoder arrives a predetermined leaf node, traceback is performed again to a parent node, and whether a node in the right side of the parent node is visited may be identified. In the case in which a node in the right side of the parent node is identified as not being visited, the decoder may visit the corresponding node. Otherwise, traceback is performed to the parent node in the upper side. The procedure performed in the binary tree accurately describes the operation of SC decoding that is efficiently implemented. The example of FIG. 7 visits a leaf node corresponding to bit $u_4$, visits a parent node at stage $t=1$ (depth $t=2$), and immediately visits a leaf node corresponding to bit $u_5$ in $t=0$ (depth $t=3$) in the right side of the parent node. This describes that an operation of stage $t=0$ is performed immediately after decoding bit $u_4$. In this instance, the number of operations performed is $N/2^{\log_2 N-0}=1$ that is the number of variable nodes indicated by a node at stage $t=0$, and a node corresponding to bit $u_5$ is a node in the right side of the parent node and thus, the type of operation is a g function. Subsequently, in the case of decoding bit $u_6$, an operation at stage $t=1$ is performed first according to the procedure of DFS.

The SCL decoding is performed as follows. SCL decoding is a method of maintaining L candidate groups determined in advance in the process of calculating and estimating an LLR value for each encoder input bit. In the case of decoding bit $u_i$, the SCL decoder takes into consideration L ($\hat{u}_0, \hat{u}_1, \ldots, \hat{u}_{i-1}$) partial estimated bit sequences obtained in the process of decoding preceding $u_0, u_1, \ldots, u_{i-1}$. Each partial estimated bit sequence candidate group is referred to as a list or a path, and a path-metric (PM) which is probability information for each list may be updated for each bit decoding. The PM is probability information associated with each list. In the case of an SCL decoder embodied based on an LLR, when the PM of a list is low, the probability of the corresponding list is high. The SCL decoder initializes the PM of each list to a predetermined value, before starting decoding, and the initial value is normally 0. The SCL decoder calculates probability information, such as the LLR of $u_i$ and the like with respect to each list ($\hat{u}_0, \hat{u}_1, \ldots, \hat{u}_{i-1}$). The SCL decoder calculates a probability, such as an LLR and the like, when $u_i$ is 0 and 1, respectively, and updates the PMs for 2Llists ($\hat{u}_0, \hat{u}_1, \ldots, \hat{u}_{i-1}, \hat{u}_i=0$) and ($\hat{u}_0, \hat{u}_1, \ldots, \hat{u}_{i-1}, \hat{u}_i=1$). Among the updated 2L lists ($\hat{u}_0, \hat{u}_1, \ldots, \hat{u}_{i-1}, \hat{u}_i \in \{0, 1\}$), L lists are selected based on the PM and the remaining list is discarded (pruning). The process may be performed sequentially according to a bit index. In the process of decoding initial $u_0$, the number of lists taken into consideration is 1, and the number of lists taken into consideration at the initial stage of decoding where the index of a bit to be decoded is low, is less than L. The number of lists becomes double every time that each unfrozen bit is decoded, and L lists are taken into consideration, as described above, when decoding is performed. Each list is decoded by independently taking into consideration different partial estimated bit sequences ($\hat{u}_0, \hat{u}_1, \ldots, \hat{u}_{i-1}$) and thus, the number of operations performed by the SCL decoder may be L times greater than the number of operations performed by the SC decoder.

Figure 8:
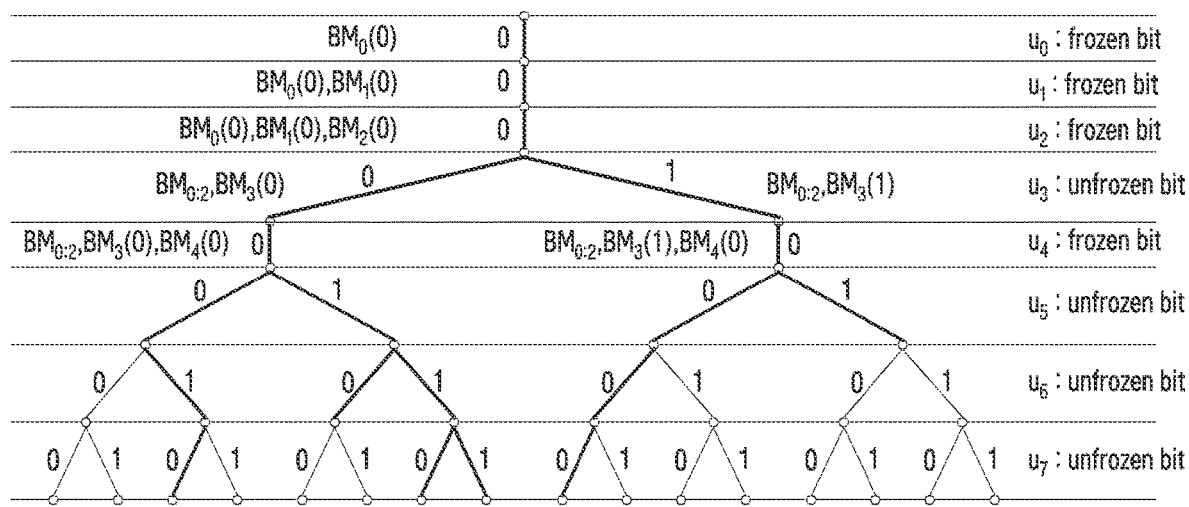
FIG. 8 is a diagram illustrating an example of a binary decision tree in a communication system according to various embodiments of the disclosure.

FIG. 8 is a diagram illustrating an example of a binary decision tree in a communication system according to various embodiments of the disclosure. FIG. 8 illustrates an embodiment of a binary decision tree that describes a process in which an SCL decoder estimates a successive bit of a polar code having a length of 8. The binary decision tree of FIG. 8 is different from a polar code graph of FIG. 5 and a decoding binary tree of FIG. 6. SCL decoding decodes an encoder input bit in order of bit indices, in the same manner as SC decoding. The operation of the SCL decoding may be construed as an operation of maintaining a maximum of L paths among possible paths starting from a root node in the binary decision tree of FIG. 8, and sequentially going down by one depth for each. The example of FIG. 8 assumes the situation in which the size of a list of the SCL decoder is determined as L=4, and a total of 4 paths is maintained for each depth. In addition, the example of FIG. 8 assumes that $\{u_0, u_1, u_2, u_4\}$ among encoder input bits of a polar code having a length of 8 are frozen bits and the remaining bits $\{u_3, u_5, u_6, u_7\}$ are determined as unfrozen bits.

Bits $u_0, u_1, u_2$ are frozen bits and thus, a bit value may be determined to be 0, irrespective of a calculated LLR value. Under the assumption that the bits $u_0, u_1, u_2$ are all 0, the LLR value for unfrozen bit $u_3$ is calculated. $BM_i$ ($\hat{u}$) marked in FIG. 8 is a probability value that an encoder input bit $u_i$ will have a value of $\hat{u}$, and is referred to as a branch metric (BM) and is obtained from an LLR value. The PM is obtained by taking into consideration BM for each bit, together. The SCL decoder of FIG. 8 may consider a maximum number of L=4 lists and thus, two lists obtained after decoding of $u_3$, ($u_0, u_1, u_2, u_3$)=(0, 0, 0, 0) and ($u_0, u_1, u_2, u_3$)=(0, 0, 0, 1), may be maintained as illustrated in FIG. 8. The PMs for the two lists may be updated based on a BM calculated for each bit value. $u_4$ is a frozen bit and thus, two lists may be updated to ($u_0, u_1, u_2, u_3, u_4$)=(0, 0, 0, 0, 0) and ($u_0, u_1, u_2, u_3, u_4$)=(0, 0, 0, 1, 0), and the PM for each list may also be updated. In this instance, although $u_4$ is a frozen bit and has a value of 0 in common. However, the values of $u_0, u_1, u_2, u_3$ assumed in each list are different from each other and thus, different LLRs and different BMs may be obtained. Through the procedure, decoding of unfrozen bit $u_5$ is performed. In the example of FIG. 8, when the SCL decoding of unfrozen bit $u_6$ is performed, 8 candidates, the number of which is greater than L=4, may be generated. In this instance, based on the calculated PM, L=4 lists are selected and the remaining lists are discarded. Through the above-procedure, in the case in which decoding of all bits is completed, a total of L=4 lists are generated, and the decoder may select and output a single list that is determined as having the highest probability based on a PM. In the case in which an outer encoding such as a CRC code or the like is concatenated together, a list that satisfies the condition for a CRC code, and is determined as having the highest probability based on a PM may be selected and output among the lists.

Decoding technology according to various embodiments may have an SCL decoder that provides a low complexity and latency without loss of performance. To this end, operations performed by the SCL decoder will be analyzed in detail and a part that needs to be upgraded from the perspective of complexity and latency will be identified. Referring to the binary decision tree of FIG. 8, a decoding process according to an embodiment will be described as follows.

With respect to each bit $u_i$, i=0, . . . , N−1, a BM calculated according to an estimated value may be taken into consideration when a maximum number of L paths or lists are selected from the binary decision tree. As illustrated in FIG. 8, BMs calculated for frozen bits before a first unfrozen bit may be included, as they are, in all PMs obtained later, and they may act as a kind of constant that is included in common among different PMs. Therefore, the BMs calculated by the SCL decoder for frozen bits before a first unfrozen bit may not affect when the SCL decoder selects L lists while proceeding with sequential decoding. In the case in which the smallest value among the unfrozen bit indices is $q_{min}$, encoder input bits $u_0, \ldots, u_{q_{min}-1}$ are frozen bits. Based on the above-description, the PM for the corresponding bits may not need to be updated. Furthermore, decoding of the corresponding bits may not need to be performed.

In an encoding process, a shortening operation for rate matching may be performed. Shortening an error correcting code is an operation of decreasing a code length (e.g., the number of output bits) and a code dimension (e.g., the number of input bits) by the same magnitude. The value of a shortened bit in a shortened polar code may be fixed to be the same as a frozen bit, and generally, may have a value of 0. In some documents, shortened bits and frozen bits are described without division, but the shortened bits and the frozen bits are used for different purposes.

Due to the structural feature of a polar code, bits to be shortened may be determined based on a binary domination rule. In consideration of shortening a J bit in a polar code having a length of N, in the case in which the index set of bits to be shorten is $u_s \subset \{0, \ldots, N-1\}$, $u_s$ includes indices having high values in a normal mother set $\{0, \ldots, N-1\}$ according to the characteristics of the binary domination.

The fact that bits having high indices are shortened means that bits disposed in the rear in a successive decoding sequence are shortened.

The decoding technology according to various embodiments may not need to update a PM for all shortened bits located after the last unfrozen bit in a shortened polar code. The value of a shortened bit is normally fixed to 0, and thus may not include information. Therefore, the decoder may not need to decode the corresponding bit. In addition, due to causality of bit generation of a polar code, a shortened bit located in the rear in the decoding sequence does not affect generation and decoding of other bits located in the foreside. In the case in which the largest value among the unfrozen bit indices in a shortened polar code is $q_{max}$, encoded input bits $u_{q^{max}+1}, \ldots, u_{N-1}$ are shortened bits. As described above, a PM may not need to be updated for the shortened bits. That is, decoding of the shortened bits may not be performed.

The decoding operation performed based on the above-described frozen bits and shortened bits, that is, the operation of a receiving device, will be described with reference to FIG. 9 or FIG. 10 below.

Figure 9:
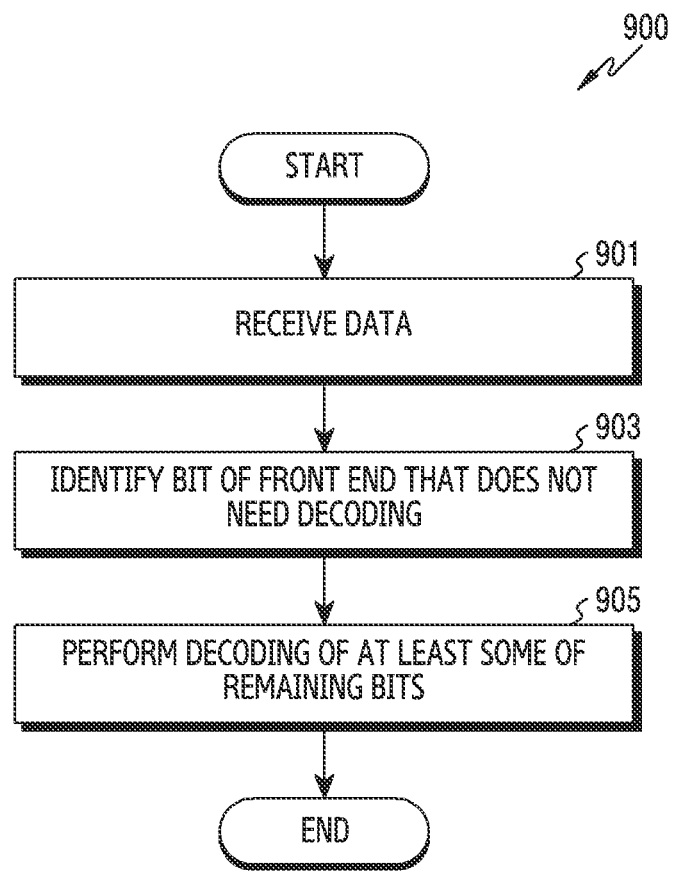
FIG. 9 is a flowchart illustrating decoding performed by a receiving device in a communication system according to various embodiments of the disclosure.

FIG. 9 is a flowchart illustrating decoding performed by a receiving device in a communication system according to various embodiments of the disclosure. FIG. 9 illustrates an operation method of the receiving device 120.

Referring to FIG. 9, in operation 901, a receiving device receives data. The data includes a plurality of bits encoded using a polar code. In the case in which the receiving device is a user equipment (UE), the receiving device may receive a downlink control information (DCI) before receiving data. In the case in which the receiving device is a base station, the receiving device may transmit uplink control information (UCI) before receiving data.

In operation 903, the receiving device identifies at least one bit that is located in the front end and does not need to be decoded. According to an embodiment, the receiving device may identify at least one bit based on information included in DCI or UCI.

In operation 905, the receiving device may perform decoding of at least some of the remaining bits. For example, in the case in which at least one bit that does not need decoding is present in the rear of the plurality of bits, the receiving device may terminate the decoding operation before it arrives at the last bit of the plurality of bits.

Figure 10:
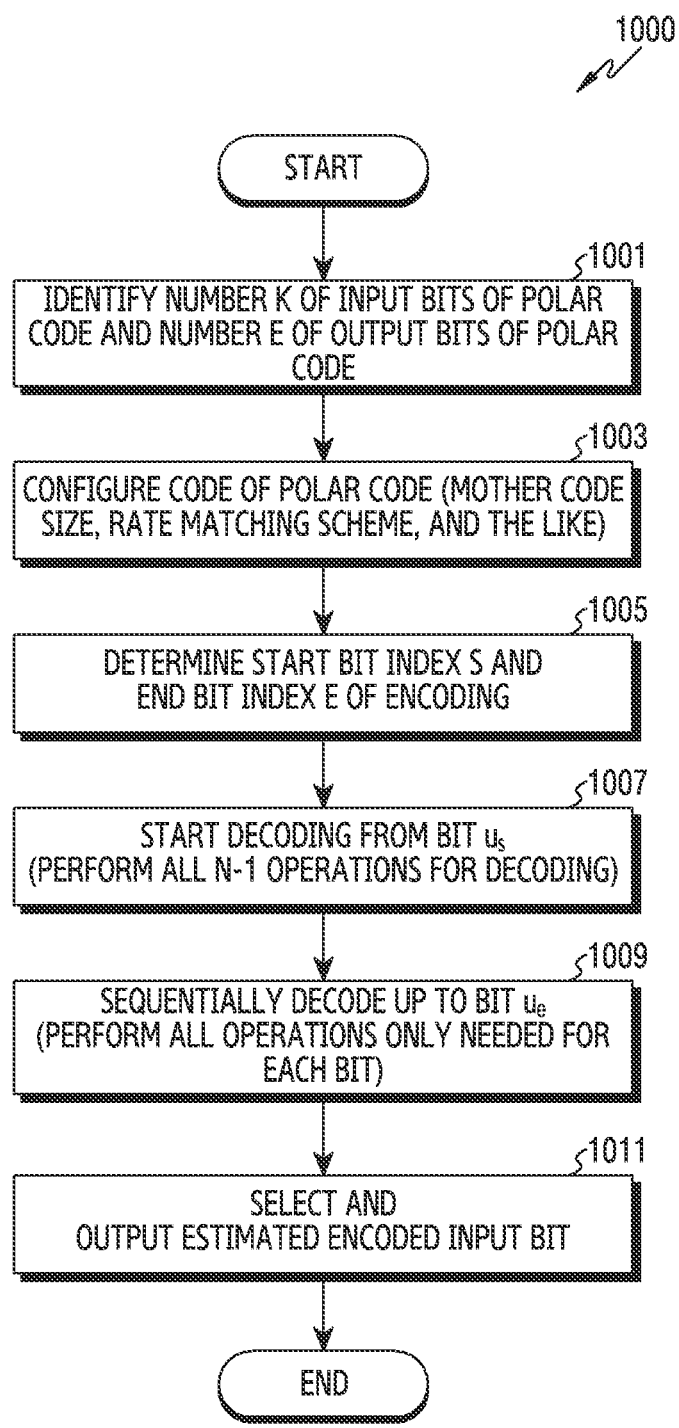
FIG. 10 is another flowchart illustrating decoding performed by a receiving device in a communication system according to various embodiments of the disclosure.

FIG. 10 is another flowchart illustrating decoding performed by a receiving device in a communication system according to various embodiments of the disclosure. FIG. 10 illustrates an operation method of the receiving device 120.

Referring to FIG. 10, in operation 1001, the receiving device identifies the number K of input bits and the number E of output bits of a polar code in operation 1001. In other words, the receiving device may identify a code dimension corresponding to the number of input bits of a code and a code length corresponding to the number of output bits, which is a given code parameter.

In operation 1003, the receiving device configures a code of a polar code to be used. For example, the receiving device may determine a mother code of a polar code to be used, a rate matching scheme, and the like, based on a code parameter.

In operation 1005, the receiving device may determine a start bit index s and an end bit index e of encoding. The receiving device may determine a bit index s at which the SCL decoder starts and a bit index e at which the SCL decoder ends, based on the determined code parameter, a coder configuration, and the like. When determining the start/end bit indices s and e based on the code parameter and a configuration, various methods may be used. According to an embodiment, s and e may be determined based on an equation related to a code parameter and a configuration. According to another embodiment, s and e may be determined based on a reference table related to a code parameter and a configuration. In addition, according to another embodiment, s and e may be determined based on an appropriate function related to a code parameter and a configuration. According to another embodiment, s and e may be determined based on at least one of machine learning, deep learning, and reinforcement learning. The SCL decoding may be performed based on the determined start index and the end bit index.

In operation 1007, the receiving device may start decoding from bit $u_s$. The SCL decoding according to various embodiments may begin with an operation of calculating the LLR of $u_s$, unlike the conventional SCL decoding. That is, before decoding $u_s$, any operation may not be performed. Therefore, a result that is obtained in advance and is to be used for calculating the LLR of $u_s$ is not present, and thus, all operations needed for decoding $u_s$ may be performed. That is, based on the intrinsic LLR at stage $\log_2 N$ given via a channel for calculating the LLR of $u_s$, the LLR values of $N/2^{\log_2 N-t}$ variable nodes may be sequentially calculated at each stage t. In this instance, the total number of operations may be N−1 as given in Equation 7.

In operation 1009, the receiving device may sequentially decode up to bit $u_e$. That is, the receiving device performs decoding of $u_{s+1}, \ldots, u_e$. In this instance, in the case of decoding each bit, a result of an operation performed on bits decoded before the corresponding bit may be used.

In operation 1011, the receiving device may select and output an estimated encoded input bit. That is, in the case in which decoding of $u_e$ is completed, the receiving device may terminate SCL decoding, and may output one of the lists. In this instance, the output list may be selected based on at least one of a PM and a decoding result associated with an outer encoding.

Through the method of FIG. 10, the SCL decoder of the receiving device may omit decoding by not decoding of at least one bit before $u_s$ and at least one bit after $u_e$, and thus, the number of times of operations needed for decoding and latency may be reduced.

In the operation, in the case in which s=0 or =N/2, an operation is performed N−1 times although the operation is not the operation of the disclosure, but it should be construed that s=0 and s=N/2 are not allowed due to the partial sequence characteristic by binary domination of a polar code sequence. From this perspective, the described decoding operation is different from the conventional scheme.

According to various embodiments, start/end bit indices s and e are determined as follows.

According to an embodiment, the decoder identifies the smallest nonfrozen bit index $q_{min}$ and the largest unfrozen bit index $q_{max}$ of a polar code configured according to a code parameter and a configuration, and based thereon, may set s=$q_{min}$ and e=$q_{max}$, respectively. In the configuration, in the case in which the rate matching method of a polar code is puncturing, repetition, extension, and the like, as opposed to shortening, it is fixed that e=$q_{max}$=N−1. In this instance, in the case in which rate matching method is used, as opposed to shortening, a bit having the highest reliability among encoder input bits is $u_{N-1}$. Accordingly, the characteristic in which this bit is selected as an unfrozen bit is taken into consideration in advance. In the case in which $q_{min}$ and $q_{max}$ determined according to a code parameter are used as start/end bit indices, respectively, decoding of the most bits may be skipped, and the maximum decrease in the complexity and latency may be obtained.

According to another embodiment, the decoder may identify the smallest unfrozen bit index $q_{min}$ and the largest unfrozen bit index $q_{max}$ of a polar code configured according to a given code parameter and a configuration, and thus, may determine s and e in the ranges that satisfy $0 \leq s \leq q_{min}$ and $q_{max} \leq e \leq N-1$, respectively. The decoder configured according to the embodiment may skip decoding of a smaller bit, in comparison with the decoder of an embodiment that sets the start/end bit indices to $s=q_{min}$ and $e=q_{max}$ for each code parameter. Therefore, in comparison with the above-described embodiment, the decoder configured according to the embodiment may provide high complexity in decoding and latency. However, the number of operations performed, the amount of memory, and the like used by the decoder to determine s and e for each code parameter is small.

Figure 11:
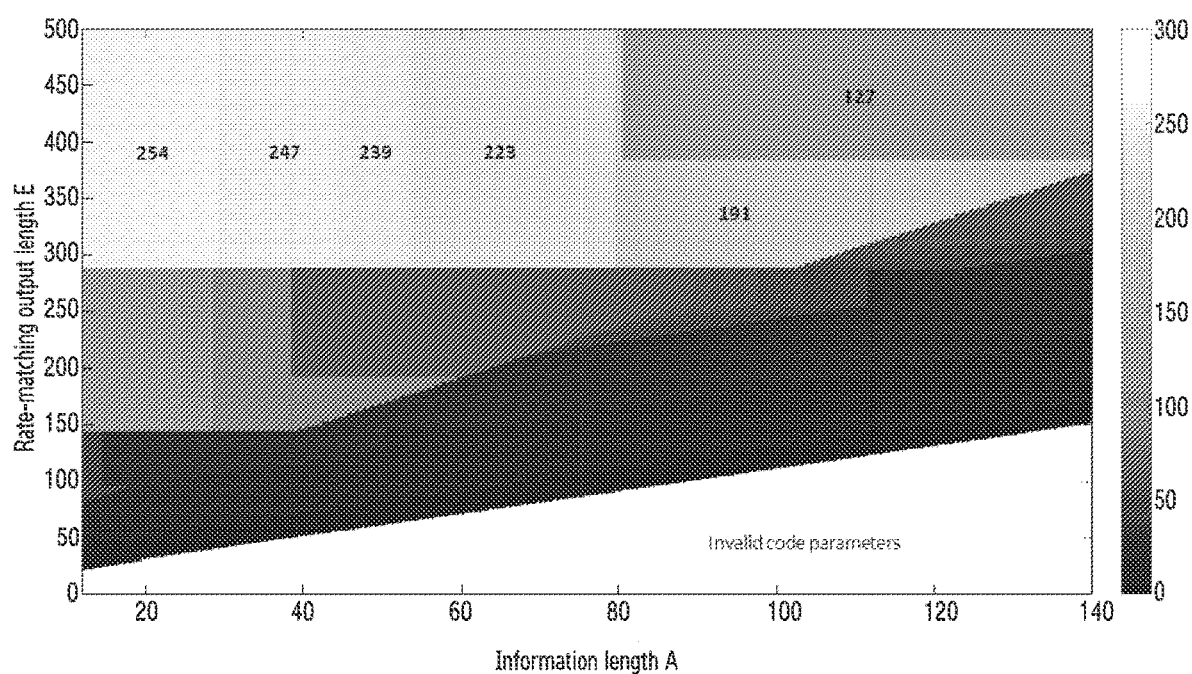
FIG. 11 is a diagram illustrating an example of the distribution of start bit indices in a communication system according to various embodiments of the disclosure.

FIG. 11 is a diagram illustrating an example of the distribution of start bit indices in a communication system according to various embodiments of the disclosure. FIG. 11 illustrates a first unfrozen bit index, that is, $q_{min}$, of a polar code configured based on the number A of encoder input bits and the number E of output bits after rate matching is performed, in a polar code system for a 3GPP NR downlink. In FIG. 11, $q_{min}$ is marked with shading. When it is bright, the value thereof is high. When it is dark, the value thereof is low. As illustrated in FIG. 11, the value of $q_{min}$ is the same in a combination of (A, E) in a predetermined range. In addition, the value of $q_{min}$ in a similar parameter combination of (A, E) that uses the same mother code size N may also have a similar value. In addition, in the case in which shortening is used as rate matching method, bits having high indices are shortened, and a bit having a relatively low index becomes an unfrozen bit and thus, $q_{min}$ is decreased. By using the above-described characteristics, based on a code parameter (A, E), a mother code size N, a rate matching method and the like, a start bit index s may be efficiently determined.

Figure 12:
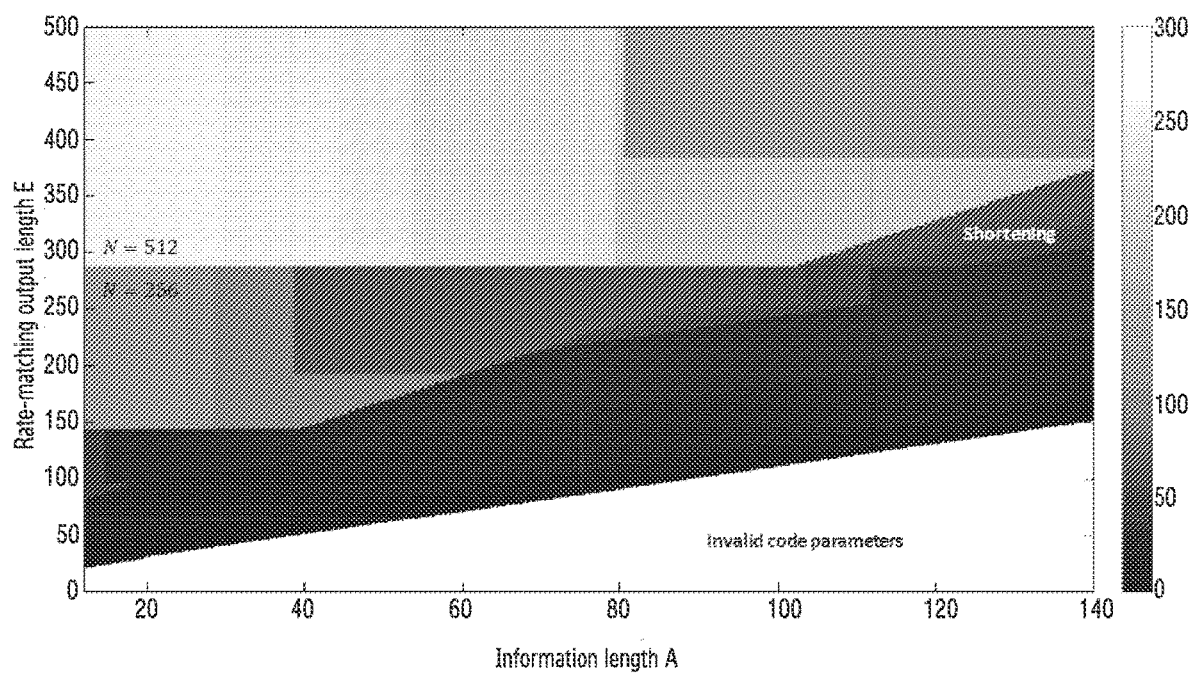
FIG. 12 is a diagram illustrating another example of the distribution of start bit indices in a communication system according to various embodiments of the disclosure.
Figure 13:
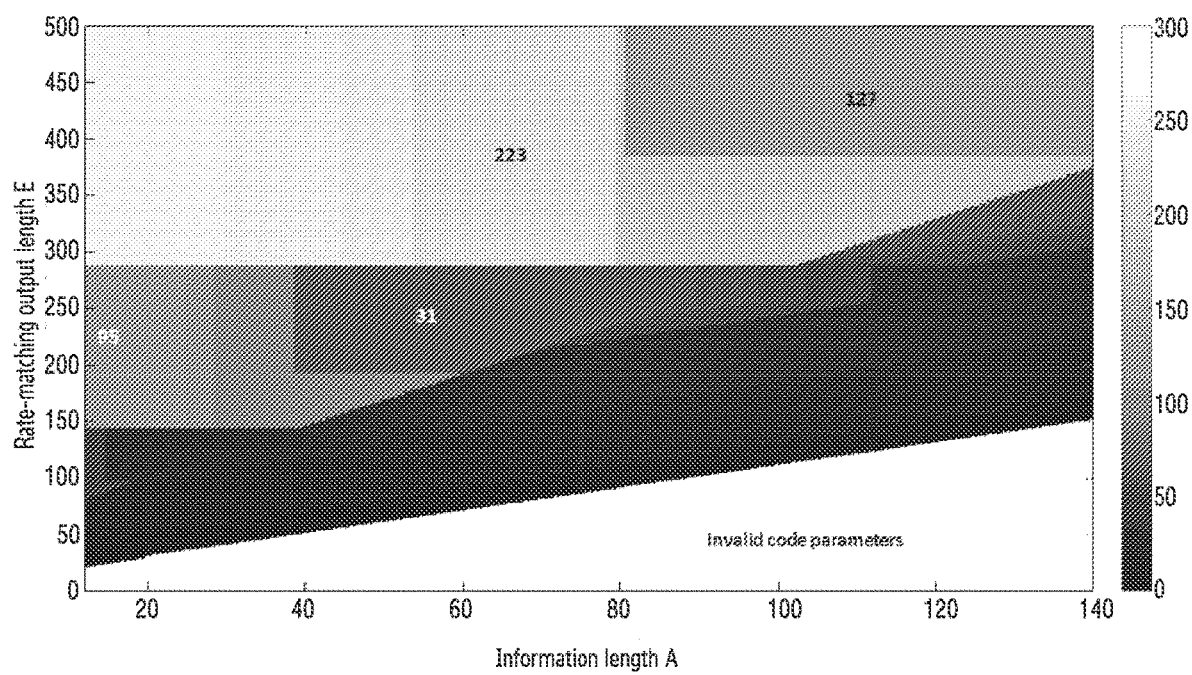
FIG. 13 is a diagram illustrating another example of the distribution of start bit indices in a communication system according to various embodiments of the disclosure.

FIGS. 12 and 13 are diagrams illustrating an embodiment that determines a bit index $0 \leq s \leq q_{min}$ at which decoding starts based on the value of $q_{min}$ associated with a combination of (A, E). As described above, the complexity of a polar code decoding and a processing time are in proportional to the size N of a mother code. In the case in which the mother code size N is large, the complexity and a processing time are high and thus, a start bit index s may be determined adaptively according to the determined N. The following is an example in which a polar code system for a downlink determines a start bit index s as illustrated in FIG. 12. The following embodiment is the simplest system, for ease of description, and it should be construed that a real system is configured with more various branches.

(1) In the case in which N<512, configuration is performed so that s=0. In the 3GPP NR downlink polar code system, the size of the maximum mother code is N=512, and in this instance, complexity and a processing time is highest. In the case in which N is less than or equal to 256, the complexity and the processing time is less than a half, and in this instance, configuration is performed so that s=0. In the case in which N is less than or equal to 256, the value of s may be determined to be greater than 0 based on $q_{min}$.

(2) In the case in which N=512, A≥80 and another rate matching method is used, as opposed to shortening, 127 that is the smallest $q_{min}$ in the corresponding area is set to s, as illustrated in FIG. 9.

(3) In the case in which N=512, A<80 and another rate matching is used, as opposed to a shortening, 233 that is the smallest $q_{min}$ in the corresponding area is set to s, as illustrated in FIG. 12.

The following is another example in which a polar code system determines a start bit index s for a downlink as illustrated in FIG. 13.

(1) In the case in which N<256, configuration is performed so that s=0.

(2) In the case in which N=512, A≥80 and rate matching is used as opposed to shortening, 127 that is the smallest $q_{min}$ in the corresponding area is set to s as illustrated in FIG. 13.

(3) In the case in which N=512, A<80 and another rate matching is used as opposed to shortening, 223 that is the smallest $q_{min}$ in the corresponding area is set to s, as illustrated in FIG. 10.

(4) In the case in which N=256, A>38 and another rate matching is used as opposed to shortening, 31 that is the smallest $q_{min}$ in the corresponding area is set to s, as illustrated in FIG. 10.

(5) In the case in which N=256, A≤38 and another rate matching is used as opposed to shortening, 95 that is the smallest $q_{min}$ in the corresponding area is set to s, as illustrated in FIG. 10.

As shown in the examples, by setting the smallest $q_{min}$ as s for a combination of (A, E) in a predetermined range A, complexity, a memory, latency, and the like needed for scheduling decoding may be reduced. The range of a combination of (A, E) that is to use the same s value may be determined in advance by taking into consideration the requirements and characteristics when a system is designed. In the case in which the purpose is to decrease a decoding complexity and latency, s may be set according to a small range of (A, E). In the case in which the purpose is to simplify decoding scheduling rather than to decrease a decoding complexity and a processing time, s may be set based on a large range of a combination of (A, E).

Figure 14:
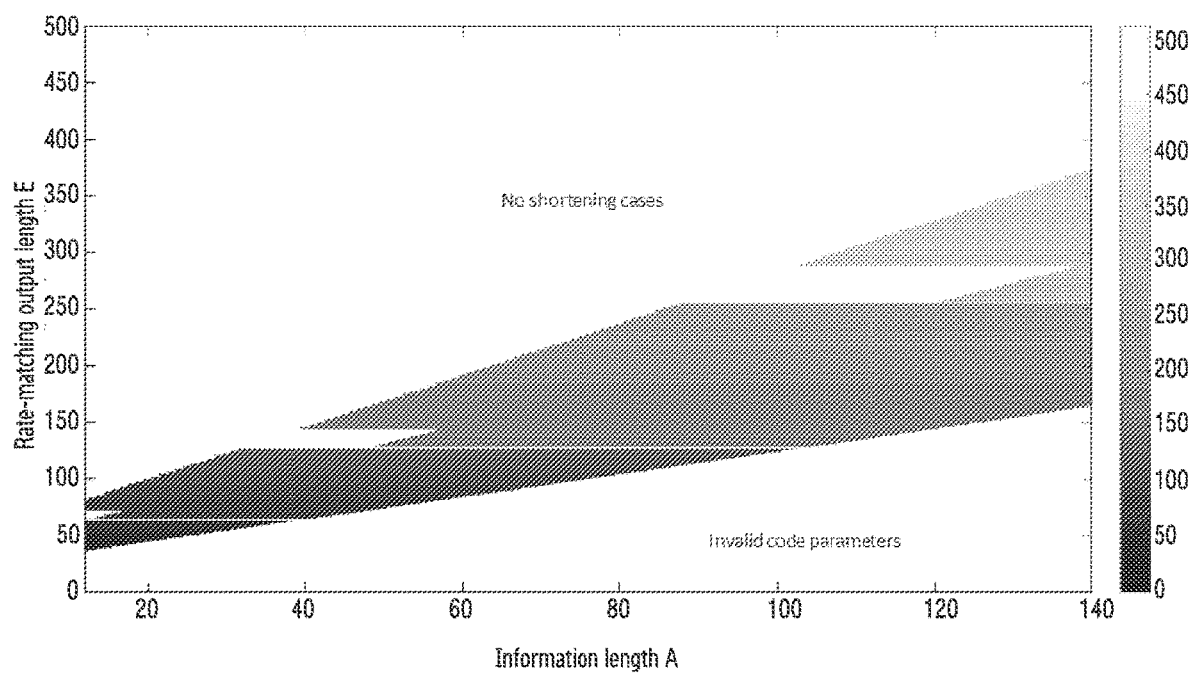
FIG. 14 is a diagram illustrating an example of the distribution of end bit indices in the case in which a shortened bit is present in a communication system according to various embodiments of the disclosure.

In the same manner as determining of s based on the distribution of $q_{min}$ values according to a code parameter (A, E), e may be determined in the range of $q_{max} \leq e \leq N-1$ based on the distribution of $q_{max}$ values according to a code parameter (A, E). In this instance, in the case in which rate matching such as puncturing, extending, repetition, and the like, is used as opposed to shortening, or any matching rate is not used since E is an $n^{th}$ power of 2, setting the value of e may be simplified in consideration that $q_{max}=N-1$ is natural decision. That is, only in the case in which the rate matching method is shortening, e is determined in the range of $q_{max} \leq e \leq N-1$ in consideration of $q_{max}$. Otherwise, it is fixed to $e=q_{max}=N-1$. FIG. 14 is a diagram illustrating $q_{max}$ that is the last unfrozen bit index of a polar code configured according to the number A of encoder input bits and the number E of output bits after rate matching, in a polar code system for 3GPP NR downlink. FIG. 14 illustrates $q_{max}$ only when the configuration of a polar code uses shortening. In this manner, based on information of $q_{max}$ that is determined in advance, e may be determined in the range of $q_{max} \leq e \leq N-1$.

Identifying the distributions of $q_{min}$ and $q_{max}$ in order to set s and e is related to designing of a decoder or a pre-processor of a decoder. It should be construed that the operation is irrelevant to a decoding operation. That is, such operation corresponds to a one-time design when a system is designed, and may not significantly increase the complexity of a decoding operation and a processing time.

Conventionally, methods to decrease the complexity and latency of an SC decoder and an SCL decoder have been proposed. Representative methods are a simplified SC (SSC) decoding scheme, and a simplified SCL (SSCL) decoding scheme. The methods correct a decoding binary tree of FIG. 5 based on a code parameter and combine some nodes so as to make a special node, and efficiently process the special node according to a predetermined method, so as to decrease the number of operations performed overall. A representative special node may include a rate-0 node, a rate-1 node, a repetition node, a single parity-check (SPC) node, and the like.

In order to implement an SSC decoder or an SSCL decoder, an operation of scheduling an operation of a decoder, such as analyzing and correcting a decoding binary tree, needs to precede according to a code parameter. In the case in which the number of combinations of code parameters that the system needs to support is low, efficient implementation may be enabled by storing information scheduled in advance in a memory or the like. However, in the case in which a large number of code parameter combinations are taken into consideration such as the case of a 3 GPP NR polar code system, it is difficult to store information scheduled in advance in a memory, and a decoder needs to analyze a decoding binary tree in advance for each code parameter, and proceeds with scheduling. In addition, in order to process the special nodes (e.g., the rate-0, rate-1, repetition, SPC node, and the like), a separate function, process, memory, or the like are needed. Although the types of special nodes are the same, the special nodes may need different functions, processes, or memories depending on the number of child nodes included in a single special node. In the special node, an operation performed for calculating an LLR and a PM is simplified but is not performed itself.

Figure 15:
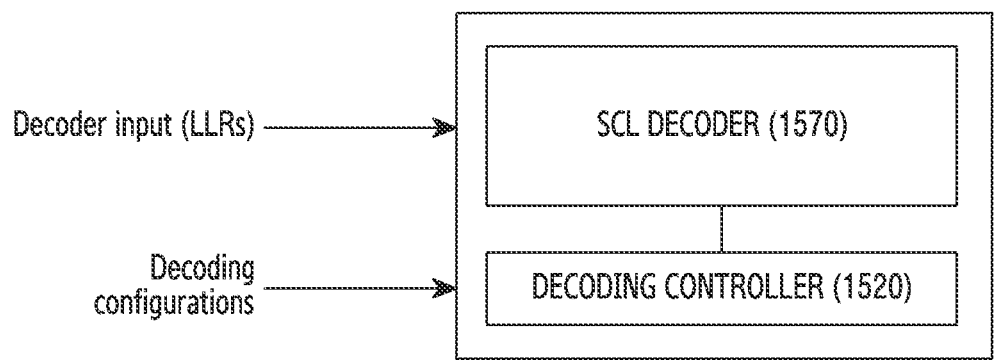
FIG. 15 is a diagram illustrating the configuration of a decoder in a communication system according to various embodiments of the disclosure.

A decoder according to various embodiments may be embodied simpler than the above-described SSC decoder or SSCL decoder. FIG. 15 is a diagram illustrating the configuration of a decoder in a communication system according to various embodiments of the disclosure. Referring to FIG. 15, the decoder may include a decoding controller 1520 and an SCL decoder 1570. The decoding controller 1520 may determine a start bit index or end bit index according to one of the above-mentioned embodiments. The SCL decoder 1570 may perform a decoding operation based on a start bit index or an end bit index determined by the decoding controller 1520.

Scheduling of decoding required from a decoder according to various embodiments may be simpler than SSC and SSCL decoding. The decoding operation according to various embodiments of the disclosure does not require analyzing a decoding binary tree, and requires simply and only determining a start bit index and an end bit index. In addition, a decoder according to various embodiments of the disclosure may decrease the complexity of scheduling of the decoder, a memory, or the like by enduring a slight performance damage. In addition, the decoding scheme according to various embodiments of the disclosure does not take into consideration a special node, and thus, may not require configuration of a separate function, process, memory, and the like according to the type and the size of a special node. Lastly, SSC decoding or SSCL decoding may calculate a PM for each special node, but a decoder according to various embodiments of the disclosure may not perform an operation on some bits.

Figure 16:
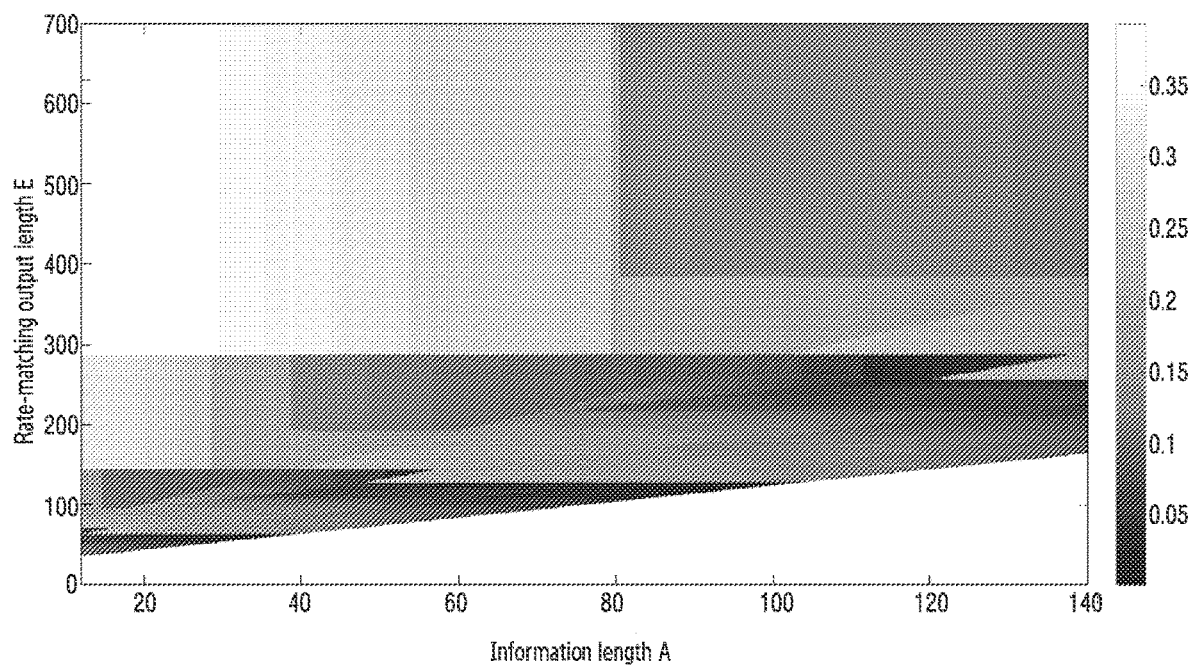
FIGS. 16 and 17 are diagrams illustrating the performance of a decoding scheme according to various embodiments of the disclosure.
Figure 17:
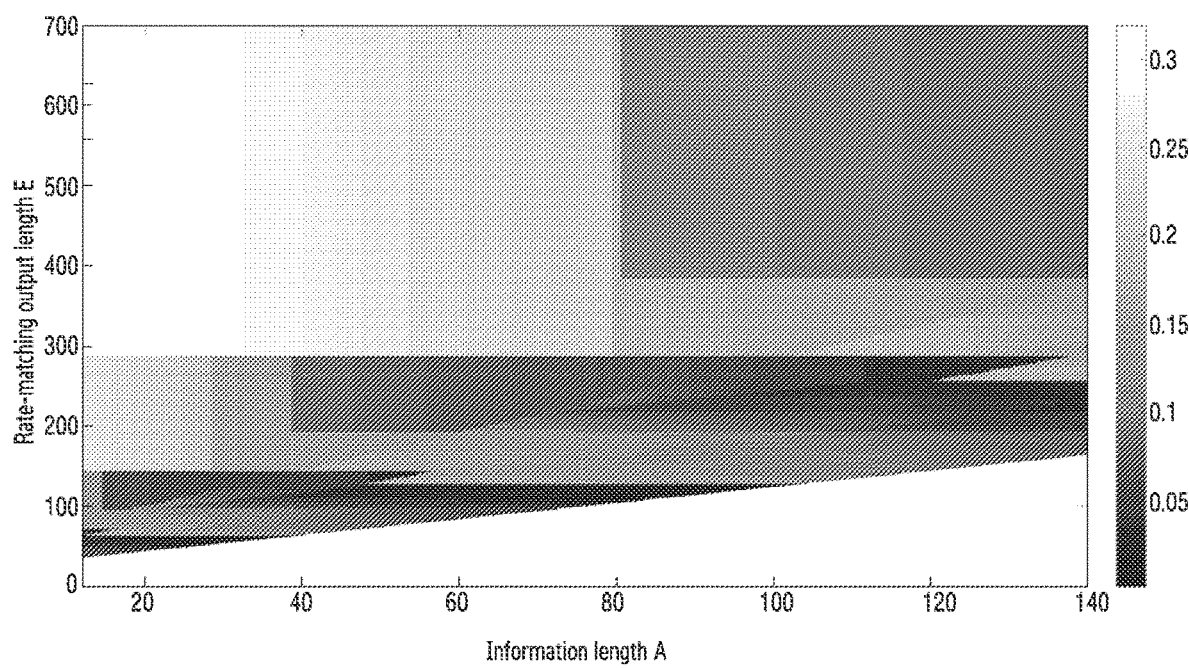

FIGS. 16 and 17 illustrate the performance of a decoding scheme according to various embodiments. FIGS. 16 and 17 consider a 3GPP NR uplink polar code system. FIG. 16 and FIG. 17 illustrate the latency reduction ratio and the complexity reduction ratio of a decoding scheme according to various embodiments of the disclosure, in comparison with a normal SCL decoding based on the number A of input bits of a polar code and the number E of rate-matched output bits. The reduction ratio at each parameter is obtained by calculating the number of operations and stages actually performed by a normal SCL decoder and an SCL decoder of the disclosure. Here, a reduction ratio of 0 indicates no decrease in complexity and latency. A reduction ratio of 1 indicates all operations are omitted. That is, when the reduction ratio is high, a complexity reduction ratio and a latency reduction ratio are high. In each drawing, such reduction ratio is marked with shading. When it is bright, a value is high. When it is dark, a value is low. In the case in which A is low as shown in each drawing, a decoding complexity and latency may be reduced up to a maximum of 40%. In consideration that uplink control information (UCI) transmitted via a 3GPP NR uplink is normally less than or equal to 100 bits, a decoding complexity and latency may be expected to be stably reduced in most UCI transmission situations.

According to various embodiments, by omitting an unnecessary operation when an SCL decoder or the like decodes a polar code-encoded codeword, the number of operations needed and an operation time may be reduced. Particularly, as described above, a block that analyzes the configuration of a code to simplify a decoding process, or adaptively performs an operation for each predetermined element based on the analyzed result is not required. Through the above, an operation and hardware additionally used/configured may be minimized to simplify polar code decoding. In addition, the decoding scheme according to various embodiments of the disclosure may inclusively support decoding of a codeword encoded with a code dimension, a code length, and a code rate, in the grand scheme of things. According to various embodiments of the disclosure, in the case in which a low coding rate is used, at least a half of the operations may be omitted and thus, a decoding complexity and latency may be reduced by approximately 40%.

The methods according to various embodiments described in the claims or the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

Although specific embodiments have been described in the detailed description of the disclosure, various modifications and changes may be made thereto without departing from the scope of the disclosure. Therefore, the scope of the disclosure should not be defined as being limited to the embodiments, but should be defined by the appended claims and equivalents thereof.

INDUSTRIAL USABILITY

The disclosure generally relates to resource allocation in a communication system and, more particularly, to a method and device for polar code decoding in a communication system.

The invention claimed is:

1. An operation method of a reception device in a communication system, the method comprising:
receiving data including a plurality of bits encoded using a polar code;
identifying at least one bit that does not need a decoding operation among the plurality of bits; and
decoding at least some of the bits remaining after excluding the at least one bit.

2. The method of claim 1, wherein the at least one bit that does not need the decoding operation is identified based on a number of input bits and a number of output bits of the polar code.

3. The method of claim 1, wherein the at least one bit that does not need the decoding operation is identified by searching for an index value corresponding to a range that a combination of a number of input bits and a number of output bits of the polar code falls within.

4. The method of claim 3, wherein the index value corresponding to the range is a minimum value among indices of first unfrozen bits of combinations of the number of input bits and the number of output bits that fall within the range.

5. The method of claim 1,
wherein the at least one bit that does not need the decoding operation is determined based on a code configuration related to the polar code that is determined based on a number of input bits and a number of output bits of the polar code, and
wherein the code configuration comprises at least one of a mother code size and a rate matching scheme.

6. The method of claim 1, wherein the at least one bit that does not need the decoding operation is specified by at least one of a start bit index for decoding and an end bit index for decoding.

7. The method of claim 1, wherein the at least one bit that does not need the decoding operation includes at least one of at least one frozen bit located in a front end among the plurality of bits and at least one shortened bit located in a back end among the plurality of bits.

8. The method of claim 1, wherein the decoding of the at least some comprises:
performing a log likelihood ratio (LLR) calculation operation a number of times that is 1 smaller than the number of plurality of bits in order to decode a foremost bit among the at least some bits.

9. The method of claim 1, further comprising:
receiving downlink control information (DCI) before receiving the data,
wherein the at least one bit that does not need the decoding operation is identified based on information included in the DCI.

10. The method of claim 1, further comprising:
transmitting uplink control information (UCI) before receiving the data,
wherein the at least one bit that does not need the decoding operation is identified based on information included in the UCI.

11. A reception device in a communication system, the device comprising:
a transceiver, and
at least one processor connected to the transceiver,
wherein the at least one processor is configured to:
receive data including a plurality of bits encoded using a polar code,
identify at least one bit that does not need a decoding operation among the plurality of bits, and
decode at least some of the bits remaining after excluding the at least one bit.

12. The device of claim 11, wherein the at least one bit that does not need the decoding operation is identified based on a number of input bits and a number of output bits of the polar code.

13. The device of claim 11, wherein the at least one bit that does not need the decoding operation is identified by searching for an index value corresponding to a range that a combination of a number of input bits and a number of output bits of the polar code falls within.

14. The device of claim 13, wherein the index value corresponding to the range is a minimum value among indices of first unfrozen bits of combinations of the number of input bits and the number of output bits that fall within the range.

15. The device of claim 11,
wherein the at least one bit that does not need the decoding operation is determined based on a code configuration related to the polar code that is determined based on the number of input bits and the number of output bits of the polar code, and
wherein the code configuration comprises at least one of a mother code size and a rate matching scheme.

* * * * *